(12) United States Patent
Wada et al.

(10) Patent No.: US 9,516,749 B2
(45) Date of Patent: Dec. 6, 2016

(54) ELECTRONIC COMPONENT-MOUNTED STRUCTURE, IC CARD AND COF PACKAGE

(71) Applicant: PANASONIC INTELLECTUAL PROPERTY MANAGEMENT CO., LTD., Osaka (JP)

(72) Inventors: Yoshiyuki Wada, Osaka (JP); Tadahiko Sakai, Osaka (JP); Koji Motomura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 186 days.

(21) Appl. No.: 14/412,395

(22) PCT Filed: Feb. 21, 2013

(86) PCT No.: PCT/JP2013/000991
§ 371 (c)(1),
(2) Date: Dec. 31, 2014

(87) PCT Pub. No.: WO2014/006787
PCT Pub. Date: Jan. 9, 2014

(65) Prior Publication Data
US 2015/0163903 A1    Jun. 11, 2015

(30) Foreign Application Priority Data
Jul. 4, 2012   (JP) .................. 2012-150649

(51) Int. Cl.
*H05K 7/00*      (2006.01)
*H05K 1/09*      (2006.01)
(Continued)

(52) U.S. Cl.
CPC ......... *H05K 1/097* (2013.01); *G06K 19/07718* (2013.01); *G06K 19/07745* (2013.01);
(Continued)

(58) Field of Classification Search
CPC ............ H01L 2924/00014; H01L 2924/00015; H01L 2224/81; H01L 2924/00012; H01L 2924/01048; H01L 2224/11312; H01L 2224/1132; H01L 2224/13016; H01L 2224/13111; H01L 2224/13144; H01L 2224/13147
See application file for complete search history.

(56) References Cited

U.S. PATENT DOCUMENTS 6,406,990 B1 * 6/2002 Kawai ................... H01L 21/563
                                                                257/737
8,878,739 B2 * 11/2014 Dokai ..................... H01Q 9/06
                                                                343/748
(Continued)

FOREIGN PATENT DOCUMENTS

EP      1 744 268 A2     1/2007
JP      2000-200332 A    7/2000
(Continued)

OTHER PUBLICATIONS

International Search Report issued in International Application No. PCT/JP2013/000991 with Date of mailing May 21, 2013, with English Translation.

*Primary Examiner* — Yuriy Semenenko
(74) *Attorney, Agent, or Firm* — McDermott Will & Emery LLP

(57) ABSTRACT

Disclosed is an electronic component-mounted structure including: a substrate, a conductive wiring pattern formed on a surface of the substrate, and an electronic component having an external terminal and being placed on the surface of the substrate at a mounting position including a terminal joint position of the conductive wiring pattern. The external terminal is joined to the conductive wiring pattern at the terminal joint position such that the external terminal is embedded in the conductive wiring pattern. Therefore, the
(Continued)

junction between the external terminal and the conductive wiring pattern can have a high strength as compared with that obtained by joining the external terminal of the electronic component to the conductive wiring pattern merely on the surface of the conductive wiring pattern.

14 Claims, 11 Drawing Sheets

(51) Int. Cl.
| | |
|---|---|
| H01L 23/14 | (2006.01) |
| H01L 23/498 | (2006.01) |
| H05K 3/32 | (2006.01) |
| H01L 23/00 | (2006.01) |
| G06K 19/077 | (2006.01) |
| H01L 21/48 | (2006.01) |
| H01L 25/065 | (2006.01) |
| H05K 1/02 | (2006.01) |
| H05K 1/03 | (2006.01) |
| H05K 1/18 | (2006.01) |
| H05K 3/12 | (2006.01) |
| G02F 1/13 | (2006.01) |

(52) U.S. Cl.
CPC ........ *H01L 21/4853* (2013.01); *H01L 23/145* (2013.01); *H01L 23/4985* (2013.01); *H01L 23/49855* (2013.01); *H01L 23/49866* (2013.01); *H01L 24/13* (2013.01); *H01L 24/16* (2013.01); *H01L 24/17* (2013.01); *H01L 24/742* (2013.01); *H01L 24/75* (2013.01); *H01L 24/81* (2013.01); *H01L 24/94* (2013.01); *H01L 24/95* (2013.01); *H01L 24/97* (2013.01); *H01L 25/0652* (2013.01); *H05K 1/0274* (2013.01); *H05K 1/0313* (2013.01); *H05K 1/181* (2013.01); *H05K 3/321* (2013.01); *G02F 1/1303* (2013.01); *H01L 2223/6677* (2013.01); *H01L 2224/1132* (2013.01); *H01L 2224/11312* (2013.01); *H01L 2224/13008* (2013.01); *H01L 2224/13016* (2013.01); *H01L 2224/13019* (2013.01); *H01L 2224/13025* (2013.01); *H01L 2224/1329* (2013.01); *H01L 2224/1336* (2013.01); *H01L 2224/1339* (2013.01); *H01L 2224/1349* (2013.01); *H01L 2224/13111* (2013.01); *H01L 2224/13144* (2013.01); *H01L 2224/13147* (2013.01); *H01L 2224/13301* (2013.01); *H01L 2224/13311* (2013.01); *H01L 2224/13318* (2013.01); *H01L 2224/13324* (2013.01); *H01L 2224/13339* (2013.01); *H01L 2224/13344* (2013.01); *H01L 2224/13347* (2013.01); *H01L 2224/13355* (2013.01); *H01L 2224/13357* (2013.01); *H01L 2224/13364* (2013.01); *H01L 2224/13369* (2013.01); *H01L 2224/13644* (2013.01); *H01L 2224/16145* (2013.01); *H01L 2224/16225* (2013.01); *H01L 2224/16227* (2013.01); *H01L 2224/16238* (2013.01); *H01L 2224/17106* (2013.01); *H01L 2224/73204* (2013.01); *H01L 2224/7526* (2013.01); *H01L 2224/7565* (2013.01); *H01L 2224/7598* (2013.01); *H01L 2224/75262* (2013.01); *H01L 2224/75651* (2013.01); *H01L 2224/75702* (2013.01); *H01L 2224/8159* (2013.01); *H01L 2224/8166* (2013.01); *H01L 2224/8184* (2013.01); *H01L 2224/81127* (2013.01); *H01L 2224/81191* (2013.01); *H01L 2224/81193* (2013.01); *H01L 2224/81203* (2013.01); *H01L 2224/81601* (2013.01); *H01L 2224/81611* (2013.01); *H01L 2224/81618* (2013.01); *H01L 2224/81624* (2013.01); *H01L 2224/81639* (2013.01); *H01L 2224/81644* (2013.01); *H01L 2224/81647* (2013.01); *H01L 2224/81655* (2013.01); *H01L 2224/81657* (2013.01); *H01L 2224/81664* (2013.01); *H01L 2224/81669* (2013.01); *H01L 2224/81815* (2013.01); *H01L 2224/81871* (2013.01); *H01L 2224/9202* (2013.01); *H01L 2224/94* (2013.01); *H01L 2224/95* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2924/12042* (2013.01); *H01L 2924/19105* (2013.01); *H05K 3/12* (2013.01); *H05K 2201/0108* (2013.01); *H05K 2201/10674* (2013.01)

(56) References Cited

U.S. PATENT DOCUMENTS

| | | | | |
|---|---|---|---|---|
| 2007/0007344 | A1* | 1/2007 | Inoue | G06K 19/07749 235/435 |
| 2010/0052163 | A1* | 3/2010 | Ouchi | H01L 21/4853 257/737 |
| 2012/0012645 | A1* | 1/2012 | Motomura | H05K 3/363 228/179.1 |

FOREIGN PATENT DOCUMENTS

| | | |
|---|---|---|
| JP | 2002-197435 A | 7/2002 |
| JP | 2005-327985 A | 11/2005 |
| JP | 2006-019606 A | 1/2006 |
| JP | 2006-278428 A | 10/2006 |
| JP | 2007-042087 A | 2/2007 |
| JP | 2009-124032 A | 6/2009 |
| JP | 2009-286934 A | 12/2009 |
| JP | 2010-219235 A | 9/2010 |
| JP | 2010-245309 A | 10/2010 |
| JP | 2012-028672 A | 2/2012 |
| JP | 2012-172135 A | 9/2012 |
| WO | 2010/116636 A1 | 10/2010 |

* cited by examiner (a)  (b)

(a)  (b)

(a)　　　　　　　(b)　　　　　　　(c)

ELECTRONIC COMPONENT-MOUNTED STRUCTURE, IC CARD AND COF PACKAGE

RELATED APPLICATIONS

This application is a national phase of International Application No. PCT/JP2013/000991, filed on Feb. 21, 2013, which in turn claims the benefit of Japanese Application No. 2012-150649, filed on Jul. 4, 2012 the disclosures of which Applications are incorporated by reference herein.

TECHNICAL FIELD

The present invention relates to an electronic component-mounted structure, an IC card, and a COF package utilizing a photocurable wiring-forming material.

BACKGROUND ART

Digital home electronic products, including cellular phones, flat panel displays, digital still cameras, and DVD recorders, have rapidly become widespread, and miniaturization and reduction in thickness of these devices are demanded. Using a more flexible substrate in the devices is an effective way to miniaturize and reduce the thickness of the devices, and the use of flexible printed circuit (FPC) boards shows a rapid increase. FPC boards are not only used as a simple circuit board, but also increasingly used as a functional module on which a semiconductor device, a microchip component, a connector, and the like are mounted.

Surface mount technology (SMT) is a widely used technique for mounting various electronic components such as an IC chip (bare chip), an electronic component module, and a passive element (chip component) onto a printed circuit board including an FPC board and a rigid printed circuit (RPC) board. In SMT, typically, after solder paste is printed on a printed circuit board, an electronic component is placed on the printed circuit board. Then, finally, the solder is melted by reflowing, and cured, thereby to electrically connect the electrode terminals of the electronic component and the wiring of the circuit board to each other (see, e.g., Patent Literature 1).

CITATION LIST

Patent Literature

[PTL 1] Japanese Laid-Open Patent Publication No. 2010-245309

SUMMARY OF INVENTION

Technical Problem

However, in the conventional technique, in order to improve the connection reliability between the electronic component and the substrate, it may become necessary to use a reinforcement material such as an underfill, an anisotropic conductive paste (ACP), and an ansotropic conductive film (ACF). In such cases, the number of processes increases, and the cost increases due to the use of those materials.

In view of the above, the present invention intends to provide an electronic component-mounted structure, an integrated circuit (IC) card and a chip-on-film (COF) package which can be produced with lower production cost and smaller number of processes and in which the electronic component can be connected with higher reliability.

Solution to Problem

One aspect of the present invention relates to an electronic component-mounted structure including:
a substrate,
a conductive wiring pattern formed on a surface of the substrate, and
an electronic component having an external terminal and being placed on the surface of the substrate at a mounting position including a terminal joint position of the conductive wiring pattern.

The external terminal is joined to the conductive wiring pattern at the terminal joint position, and the external terminal is embedded in the conductive wiring pattern.

Another aspect of the present invention relates to an IC card including:
a substrate,
an antenna circuit formed on a surface of the substrate, and
a bare chip component having an external terminal and being placed on the surface of the substrate at a mounting position including a terminal joint position of the antenna circuit.

The external terminal is joined to the antenna circuit at the terminal joint position, and the external terminal is embedded in the antenna circuit.

Yet another aspect of the present invention relates to a COF package including:
a film substrate,
a conductive wiring pattern formed on a surface of the substrate,
a first electronic component having an external terminal and being placed on the surface of the substrate at a mounting position including a terminal joint position of the conductive wiring pattern, and
a second electronic component connected to the first electronic component via the conductive wiring pattern.

The external terminal of the first electronic component is joined to the conductive wiring pattern at the terminal joint position, and the external terminal is embedded in the conductive wiring pattern.

The conductive wiring pattern preferably contains a metal having a high melting point and a high electrical conductivity, such as Cu, Ag, Ni, Au, Pd, Pt, and Al, in an amount of 75 mass % or more.

Advantageous Effects of Invention

In the present invention, the external terminal of an electronic component is joined to the conductive wiring pattern of a substrate such that the external terminal is embedded in the conductive wiring pattern. Therefore, the junction between the external terminal and the conductive wiring pattern can have a high strength as compared with that obtained by joining the external terminal of the electronic component to the conductive wiring pattern simply on the surface of the conductive wiring pattern. Therefore, the electronic component and the substrate can be highly reliably connected to each other, without reinforcing the junction using a reinforcement material such as an underfill.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
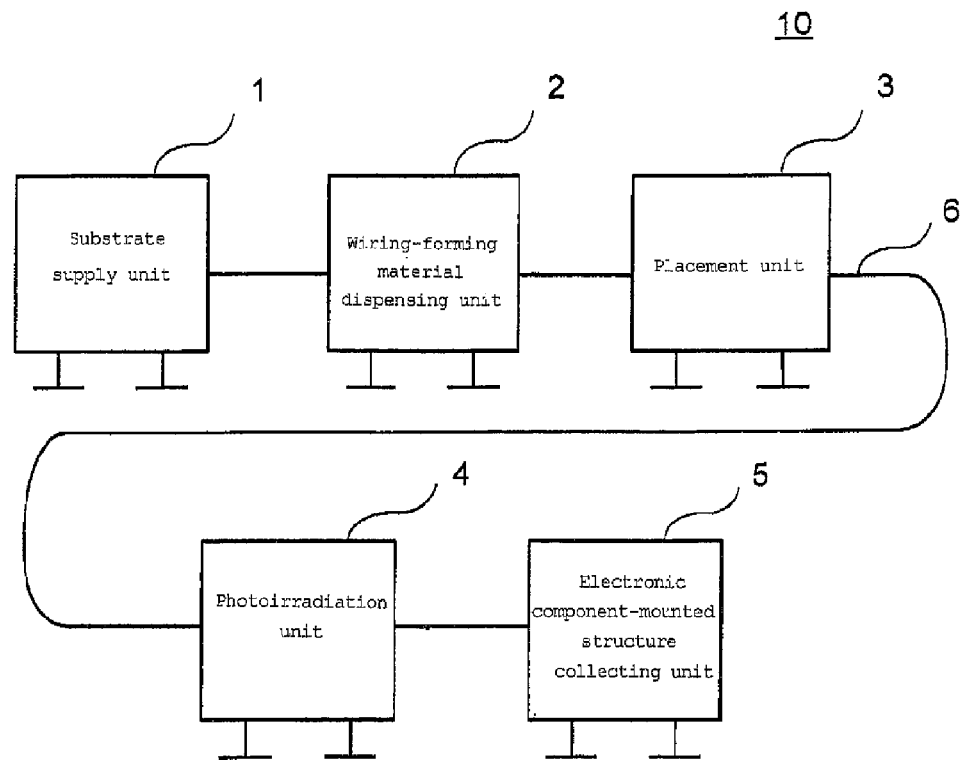
FIG. 1 A block diagram of an overview of a surface mount line which is a production system for producing an electronic component-mounted structure according to one embodiment of the present invention.

An electronic component-mounted structure of the present invention includes: a substrate, a conductive wiring pattern formed on a surface of the substrate, and an electronic component having an external terminal and being placed on the surface of the substrate at a mounting position including a terminal joint position of the conductive wiring pattern. The external terminal is joined to the conductive wiring pattern at the terminal joint position, and the external terminal is embedded in the conductive wiring pattern. The "conductive wiring pattern" as used herein refers to the wiring itself, and does not include any other elements such as a terminal connection electrode (land electrode) formed on the wiring, and a solder (e.g., precoat solder) applied onto the wiring or electrode. In other words, in the electronic component-mounted structure of the present invention, the substrate wiring and the external terminal of the electronic component are directly joined to each other, without any other elements therebetween.

In the electronic component-mounted structure of the present invention, the external terminal of the electronic component is joined to the conductive wiring pattern such that the external terminal is embedded in the conductive wiring pattern. Therefore, as compared with when the external terminal of the electronic component is joined to the conductive wiring pattern merely on its surface, the external terminal and the conductive wiring pattern can be joined to each other over a large contact area. As a result, the joint strength between the external terminal of the electronic component and the conductive wiring pattern can be increased, and the connection reliability between the electronic component and the substrate can be improved.

Furthermore, due to an increased joint strength between the external terminal of the electronic component and the conductive wiring pattern, when the electronic component has a sufficiently large number of external terminals, the electronic component can be connected to the substrate with sufficient strength. In such a case, it becomes unnecessary to use a reinforcement material such as an underfill, leading to a lower production cost. Moreover, the reinforcement process such as dispensing of a reinforcement material can be omitted, leading to a smaller number of processes, which can improve the productivity of the electronic component-mounted structure. In addition, a reduction in production cost resulting from the reduced number of processes can also be expected.

In one embodiment of the present invention, the conductive wiring pattern is formed from a photocurable wiring-forming material having fluidity. The wiring-forming material may contain fine particles of conductive material, such as Cu particles having an average particle diameter of 1 to 10 nm. For example, by using a conductive ink comprising such fine particles of conductive material dispersed in a liquid medium and being curable upon irradiation with light, a photocurable wiring pattern corresponding to the conductive wiring pattern is formed on a surface of the substrate. Then the electronic component is placed at the mounting position on the substrate surface such that the external terminal of the electronic component lands on the photocurable wiring pattern at the terminal joint position of the conductive wiring pattern.

In the photocurable wiring pattern, the wiring-forming material is kept having fluidity or deformability. This allows the external terminal to sink into the photocurable wiring pattern at the terminal joint position. In this state, by irradiating light onto the photocurable wiring pattern, the wiring-forming material cures, forming a conductive wiring pattern. In that way, at the same time when the conductive wiring pattern is formed, the external terminal of the electronic component can be joined to the conductive wiring pattern at the terminal joint position such that the external terminal is embedded in the conductive wiring pattern. By using a wiring-forming material as above, an electronic component-mounted structure having a high connection reliability between the electronic component and the substrate can be produced in a simple and easy manner.

Furthermore, by forming a conductive wiring pattern from a wiring-forming material as above, the external terminal of the electronic component can be joined to the conductive wiring pattern without performing heating process, such as reflow process and thermocompression bonding process, in producing an electronic component-mounted structure. Therefore, it is not necessary to use a highly heat-resistant material (e.g., polyimide resin) for the substrate. Instead, a material which is comparatively inexpensive but is not so high in heat resistance, for example, a thermoplastic resin having a melting point or thermolysis temperature of 300° C. or less, more specifically, for example, PET (polyethylene terephthalate) or PEN (polyethylene naphthalate), can be used to form the substrate. This can further reduce the production cost of the electronic component-mounted structure.

Moreover, it is possible to prevent deterioration due to heating of the electronic component and the substrate. For example, when a polyimide resin is used for the substrate, and a wiring pattern made of copper foil is formed on the substrate, since the color of polyimide resin is similar to the color of copper foil, the shape of wiring pattern is difficult to recognize, increasing the occurrence probability of mounting defects. In the present embodiment, since it is almost unnecessary to use a polyimide resin, the yield can be easily improved, and the production cost of the electronic component-mounted structure can be further reduced.

Typically, the external terminal preferably contains gold in at least its outermost surface because this can prevent the formation of oxide film. In this regard, in the electronic component-mounted structure in the present embodiment, since heating process can be omitted in the production, the external terminal will not be oxidized by heating. Therefore, the external terminal may be of, for example, copper, a copper alloy, tin, or a tin alloy. This can further suppress the production cost. In the case of taking other measures to prevent the formation of oxide film, the present invention can be applied to a BGA (ball grid allay) electronic component with a solder bump (electrode) formed on its surface facing the substrate.

Any type of electronic component can be included in the electronic component-mounted structure without particular limitation. Examples of the electronic component that can be included in the electronic component-mounted structure are bare chip components such as IC chips, package components including an interposer, electronic component modules, chip components such as passive elements, and semiconductor stacks having through electrodes. The present invention is particularly suitable for SMT such as flip-chip mount technology. Therefore, a preferable electronic component is one having an external terminal on its surface facing the substrate.

When the electronic component is a bare chip or a package, the external terminal thereof is usually preferably protruding from the surface of the electronic component facing the substrate for ensuring the contact with the electrode formed in advance on the substrate. On the other hand, in the present embodiment, since the electronic component is placed on the substrate while the wiring-forming material has fluidity and is in a deformable state, the contact of the external terminal with the photocurable wiring pattern can be achieved by the flow or deformation of the wiring-forming material, even though the external terminal is not protruding from the surface facing the substrate. As such, it is not necessary to make the external terminal protruded, and the production cost of the electronic component can be reduced.

The present invention can be suitably applicable to an electronic component-mounted structure including a film substrate with flexibility on which an electronic component is mounted.

Furthermore, in the present invention, the conductive wiring pattern is formed from a photocurable wiring-forming material with fluidity. Thus, the substrate preferably has light permeability, for irradiating light onto the wiring-forming material. By using such a substrate, light can be allowed to pass through the substrate from the side opposite to a mounting surface for mounting an electronic component thereon, and irradiated onto the wiring-forming material dispensed on the mounting surface. Therefore, light can be reliably irradiated also at the terminal joint position which is often covered with the electronic component or its external terminal and others. As a result, the external terminal of the electronic component can be reliably joined to the conductive wiring pattern at the terminal joint position, leading to an improved connection reliability.

The present invention relates to an IC card including: a substrate, an antenna circuit formed on a surface of the substrate, and a bare chip component having an external terminal and being placed on the surface of the substrate at a mounting position including a terminal joint position of the antenna circuit. The external terminal is joined to the antenna circuit at the terminal joint position, and the external terminal is embedded in the antenna circuit.

In the IC card of the present invention, the external terminal of the bare chip component is joined to the antenna circuit such that the external terminal is embedded in the antenna circuit. Therefore, as compared with when the external terminal of the bare chip component is joined to the antenna circuit merely on its surface, the external terminal and the antenna circuit can be joined to each other over a large contact area. As a result, the joint strength between the external terminal of the bare chip component and the antenna circuit can be increased, and the connection reliability between the bare chip component and the substrate in the IC card can be improved.

Due to an increased joint strength between the external terminal of the bare chip component and the antenna circuit, when the bare chip component has a sufficiently large number of external terminals, the bare chip component can be connected to the substrate with sufficient strength. In such a case, it becomes unnecessary to use a reinforcement material such as an underfill, leading to a lower production cost. Moreover, the reinforcement process such as dispensing of a reinforcement material can be omitted, leading to a smaller number of processes, which can improve the productivity of the IC card. In addition, a reduction in production cost resulting from the reduced number of processes can also be expected.

In one embodiment of the IC card of the present invention, the antenna circuit is formed from a photocurable wiring-forming material having fluidity. The wiring-forming material may contain fine particles of conductive material, such as Cu particles having an average particle diameter of 1 to 10 nm. For example, by using a conductive ink comprising such fine particles of conductive material dispersed in a liquid medium and being curable upon irradiation with light, a photocurable wiring pattern corresponding to the antenna circuit is formed on a surface of the substrate. Then the bare chip component is placed at the mounting position on the substrate surface such that the external terminal of the bare chip component lands on the photocurable wiring pattern at the terminal joint position of the antenna circuit.

In the photocurable wiring pattern, the wiring-forming material is kept having fluidity or deformability. This allows the external terminal to sink into the photocurable wiring pattern at the terminal joint position. In this state, by irradiating light onto the photocurable wiring pattern, the wiring-forming material cures, forming an antenna circuit. In that way, at the same time when the antenna circuit is formed, the external terminal of the bare chip component can be joined to the antenna circuit at the terminal joint position such that the external terminal is embedded in the antenna circuit. By using a wiring-forming material as above, an IC card having a high connection reliability between the bare chip component and the substrate can be produced in a simple and easy manner.

Furthermore, by forming an antenna circuit from a wiring-forming material as above, the external terminal of the bare chip component can be joined to the antenna circuit without performing heating process in producing an IC card. Therefore, it is not necessary to use a highly heat-resistant material (e.g., polyimide resin) for the substrate. Instead, a material which is comparatively inexpensive but is not so high in heat resistance can be used to form the substrate. This can reduce the production cost of the IC card. Moreover, it is possible to prevent deterioration due to heating of the electronic component and the substrate. For example, when a polyimide resin is used for the substrate, and a wiring pattern made of copper foil is formed on the substrate, since the color of polyimide resin is similar to the color of copper foil, the shape of wiring pattern is difficult to recognize, increasing the occurrence probability of mounting defects. In the present embodiment, since it is almost unnecessary to use a polyimide resin, the yield can be easily improved, and the production cost of the IC card can be further reduced.

The material of the substrate on which an antenna circuit is formed (hereinafter also referred to as "antenna circuit board") may be, for example, polyethylene terephthalate, polyethylene naphthalate, polyethylene, polypropylene, polybutyrene terephthalate, polyphenyl sulfide, polyether ether ketone, polycarbonate, liquid crystal polymer, polystyrene, acrylic resin, polyacetal, polyphenyl ether, acrylonitrile-styrene copolymer, and acrylonitrile-butadiene-styrene copolymer resin. For the same reason as above, the antenna circuit board may be a film substrate, and the antenna circuit board preferably has light permeability.

The present invention relates to a COF package including: a film substrate, a conductive wiring pattern formed on a surface of the substrate, a first electronic component having an external terminal and being placed on the surface of the substrate at a mounting position including a terminal joint position of the conductive wiring pattern, and a second electronic component connected to the first electronic component via the conductive wiring pattern. The external terminal of the first electronic component is joined to the conductive wiring pattern at the terminal joint position, and the external terminal is embedded in the conductive wiring pattern.

In the COF package of the present invention, the external terminal of the first electronic component is joined to the conductive wiring pattern such that the external terminal is embedded in the conductive wiring pattern. Therefore, as compared with when the external terminal of the first electronic component is joined to the conductive wiring pattern merely on its surface, the external terminal and the conductive wiring pattern can be joined to each other over a large contact area. As a result, the joint strength between the external terminal of the first electronic component and the conductive wiring pattern can be increased, and the connection reliability between the first electronic component and the substrate in the COF package can be improved.

Due to an increased joint strength between the external terminal of the first electronic component and the conductive wiring pattern, when the first electronic component has a sufficiently large number of external terminals, the first electronic component can be connected to the substrate with sufficient strength. In such a case, it becomes unnecessary to use a reinforcement material such as an underfill, leading to a lower production cost. Moreover, the reinforcement process such as dispensing of a reinforcement material can be omitted, leading to a smaller number of processes, which can improve the productivity of the COF package. In addition, a reduction in production cost resulting from the reduced number of processes can also be expected. An example of the first electronic component is a liquid crystal driver. In this case, the second electronic component may be a liquid crystal panel.

In one embodiment of the COF package of the present invention, the conductive wiring pattern is formed from a photocurable wiring-forming material having fluidity. The wiring-forming material may contain fine particles of conductive material, such as Cu particles having an average particle diameter of 1 to 10 nm. For example, by using a conductive ink comprising such fine particles of conductive material dispersed in a liquid medium and being curable upon irradiation with light, a photocurable wiring pattern corresponding to the conductive wiring pattern is formed on a surface of the substrate. Then the first electronic component is placed at the mounting position on the substrate surface such that the external terminal of the first electronic component lands on the photocurable wiring pattern at the terminal joint position of the conductive wiring pattern.

In the photocurable wiring pattern, the wiring-forming material is kept having fluidity or deformability. This allows the external terminal to sink into the photocurable wiring pattern at the terminal joint position. In this state, by irradiating light onto the photocurable wiring pattern, the wiring-forming material cures, forming a conductive wiring pattern. In that way, at the same time when the conductive wiring pattern is formed, the external terminal of the first electronic component can be joined to the conductive wiring pattern at the terminal joint position such that the external terminal is embedded in the conductive wiring pattern. By using a wiring-forming material as above, a COF package having a high connection reliability between the first electronic component and the substrate can be produced in a simple and easy manner. Likewise, the external terminal of the second electronic component can be joined to the conductive wiring pattern at the terminal joint position of the conductive wiring pattern such that the external terminal is embedded in the conductive wiring pattern.

By forming a conductive wiring pattern from a wiring-forming material as above, the external terminal of the first electronic component can be joined to the conductive wiring pattern without performing heating process in producing a COF package. Therefore, it is not necessary to use a highly heat-resistant material (e.g., polyimide resin) for the substrate. Instead, a material which is comparatively inexpensive but is not so high in heat resistance can be used to form the substrate. This can reduce the production cost of the COF package. Moreover, it is possible to prevent deterioration due to heating of the electronic component and the substrate. For example, when a polyimide resin is used for the substrate, and a wiring pattern made of copper foil is formed on the substrate, since the color of polyimide resin is similar to the color of copper foil, the shape of wiring pattern is difficult to recognize, increasing the occurrence probability of mounting defects. In the present embodiment, since it is almost unnecessary to use a polyimide resin, the yield can be easily improved, and the production cost of the COF package can be further reduced.

The material of the substrate on which a conductive wiring pattern is formed may be, for example, polyethylene terephthalate, polyethylene naphthalate, polyethylene, polypropylene, polybutyrene terephthalate, polyphenyl sulfide, polyether ether ketone, polycarbonate, liquid crystal polymer, polystyrene, acrylic resin, polyacetal, polyphenyl ether, acrylonitrile-styrene copolymer, and acrylonitrile-butadiene-styrene copolymer resin. For the same reason as above, the substrate may be a film substrate, and the substrate preferably has light permeability.

Next, embodiments of the present invention will be more specifically described with reference to the drawings.

Embodiment 1

FIG. 1 is a block diagram of a surface mount line which is a production system for producing an electronic component-mounted structure according to one embodiment of the present invention.

A line 10 illustrated in the figure includes a substrate supply unit 1 for supplying a substrate, a wiring-forming material dispensing unit 2, a placement unit 3, a photoirradiation unit 4, an electronic component-mounted structure collecting unit 5, and a carrying machine 6 for transporting or carrying substrates from one unit to another.

The line 10 can be a surface mount line employing a carrier transport system in which one substrate for mounting a set of electronic components thereon is loaded on an independent carrier board, and the carrier board is transported from one unit to another by a conveyor serving as the carrying machine 6. In this case, the substrate supply unit 1 is, for example, a magazine-type substrate loader, and the electronic component-mounted structure collecting unit 5 is, for example, a magazine-type substrate unloader.

Alternatively, the line 10 can be a surface mount line configured to mount a plurality of sets of electronic components, with predetermined intervals between the sets, onto a substrate materiel including a plurality of substrates and being in the form of, for example, a long tape-like film, so that one set is mounted on one substrate. In this case, the substrate supply unit 1 may be a supply roll from which the substrate material is drawn, and the electronic component-mounted structure collecting unit 5 may be a take-up roll on which the substrate material with electronic components mounted thereon is collected. In short, the line 10 can be a roll-to-roll system surface mount line. The "substrate material" refers to a material that can be cut into a plurality of independent substrates. In other words, in the present specification, the substrate material includes a plurality of substrates which are integrally connected with one another.

In Embodiment 1, the case where the electronic component-mounted structure is produced on a surface mount line employing a carrier transport system is described.

Figure 2A:
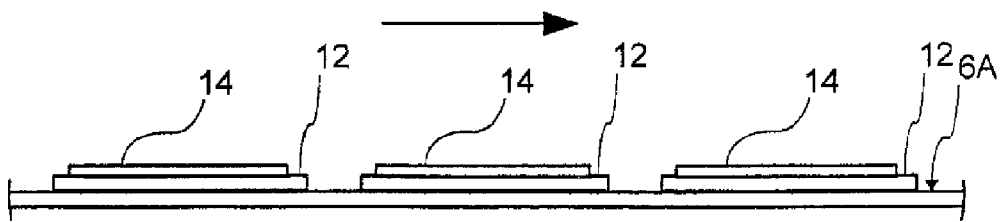
FIG. 2A A front view illustrating substrates being transported by a conveyor serving as a carrying means, on a surface mount line employing a carrier transport system.
Figure 2B:
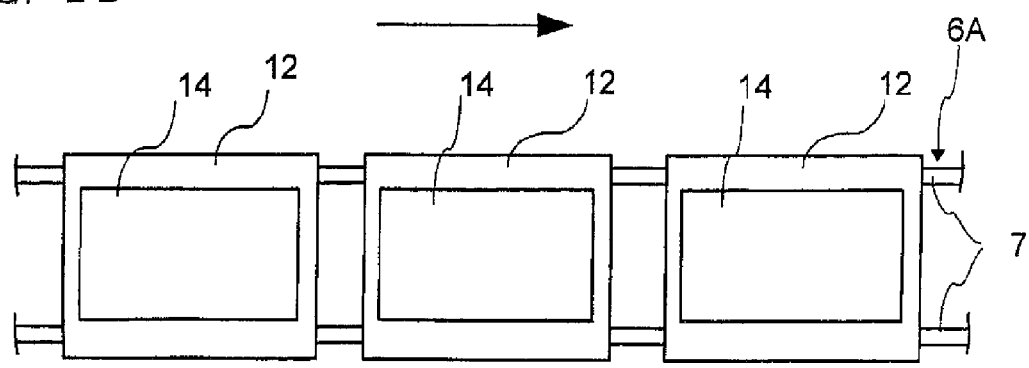
FIG. 2B A top view illustrating the substrates being transported by the conveyor serving as a carrying means, on the surface mount line employing a carrier transport system.

FIGS. 2A and 2B are a front view and a top view, respectively, illustrating substrates 14 carried by a conveyor 6A serving as a carrying means, when the line 10 of FIG. 1 is a surface mount line employing a carrier transport system. The conveyor 6A includes a long pair of board supports 7 arranged in parallel to each other. The substrates 14 are loaded one by one on the carrier boards 12. The carrier boards 12 are set on the conveyor 6A at predetermined intervals, with both ends of each carrier board 12 in the direction perpendicular to the transport direction (shown by the arrow in the figure) being supported by the board supports 7. Since the carrier board 12 is supported at its both ends by the pair of board supports 7, the underside of the carrier board 12 is not covered with the conveyor 6A, and a portion corresponding at least to a region where a wiring pattern is to be formed on the substrate 14 (hereinafter also referred to as "wiring-forming region") is exposed downward.

The substrate 14 can be fixed onto the carrier board 12 with a heat-resistant tape. Alternatively, the substrate 14 can be fixed by applying a sticky material with low stickiness onto a surface of the carrier board 12 to face the substrate 14. In the latter case, since the underside (second surface) of the substrate 14 is entirely fixed onto the carrier board 12, even when the substrate 14 is flexible, variations in height due to the waviness of the substrate 14 or other causes can be reduced.

The carrier board 12 may be formed of, for example, a material with light permeability for the below-described reason. Examples of such a material include quartz glass and light-permeable resin. This is not a limitation, and the carrier board 12 may be formed of a non-transparent material such as Al that does not allow light to pass through. In the latter case, by cutting a light-permeable hole or inlaying a transparent member at a portion corresponding to the photocurable wiring pattern, light can be allowed to permeate or pass therethrough. For the same reason, the substrate 14 also may be formed of a material with light permeability. Examples of the light-permeable resin include: polyethylene, polypropylene, polybutyrene terephthalate, polyphenyl sulfide, polyether ether ketone, polyethylene terephthalate (PET), polyethylene naphthalate (PEN), polycarbonate, liquid crystal polymer, polystyrene, acrylic resin, polyacetal, polyphenyl ether, acrylonitrile-styrene copolymer, and acrylonitrile-butadiene-styrene copolymer resin. These resins may be used singly or in combination of two or more. For example, a polymer alloy of two or more resins may be used.

The wiring-forming material dispensing unit 2 may include, for example, a dispensing machine equipped with a dispensing head having a needle or nozzle and a dispenser. Using such a dispensing machine, an ink serving as a below-described photocurable wiring-forming material is applied so as to draw a desired wiring pattern on a component-mounting surface (first surface) of the substrate 14. In that way, a photocurable wiring pattern is formed. Alternatively, the wiring-forming material dispensing unit 2 may include a printing machine for printing a photocurable wiring pattern with the aforementioned ink on the first surface of the substrate 14. Examples of the printing machine include a screen printer and an ink jet printer.

Figure 3:
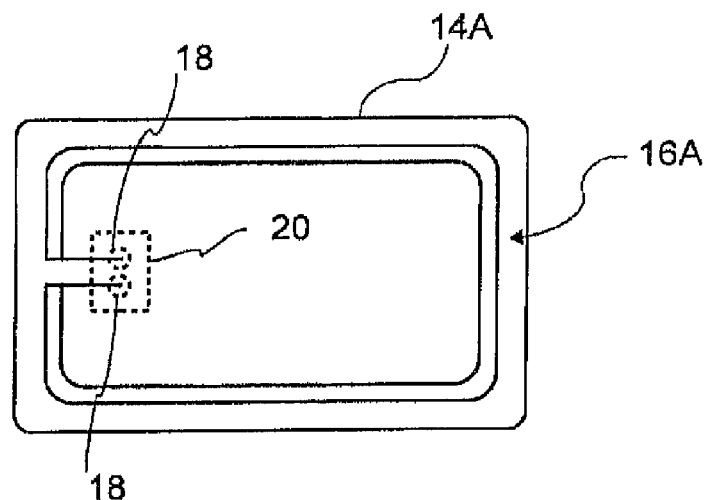
FIG. 3 A top view of an antenna circuit board provided with a photocurable wiring pattern corresponding to an antenna circuit for IC cards, the antenna circuit being an example of a conductive wiring pattern.

FIG. 3 is a top view of an antenna circuit board provided with a photocurable wiring pattern corresponding to an antenna circuit for IC cards, the antenna circuit being an example of a conductive wiring pattern. A photocurable wiring pattern 16A is of a coil pattern, and terminal joint positions 18 are at both ends of the conductive wire. The terminal joint positions 18 are included in a mounting position 20 at which an electronic component is to be mounted, on the first surface of a substrate 14A (the front side of the paper).

The placement unit 3 may include: an electronic component supplying machine such as a tape feeder, a bulk feeder, and a tray feeder; and a chip mounter for placing an electronic component supplied from the electronic component supplying machine on the substrate. The chip mounter is equipped with, for example, a suction nozzle.

Figure 4:
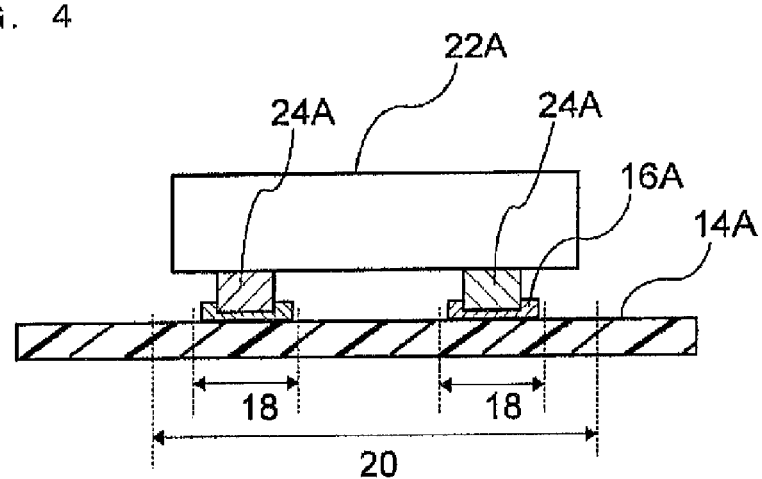
FIG. 4 A side view of illustrating an IC chip (bare chip component) for IC cards, an example of an electronic component, placed on a substrate at a mounting position.

FIG. 4 is a side view schematically illustrating an IC chip 22A (bare chip component) for IC cards, an example of an electronic component, placed at the mounting position 20. The IC chip 22A has a plurality of external terminals 24A on its underside. The external terminals 24A are each contacted with the photocurable wiring pattern 16A at the terminal joint positions 18.

In the state illustrated in the figure, since the photocurable wiring pattern 16A is not yet cured, the external terminals 24A sink into the photocurable wiring pattern 16A having fluidity or deformability. When the photocurable wiring pattern 16A is cured in the later photoirradiation process and thus a conductive wiring pattern (antenna circuit) is formed, the external terminals 24A are firmly joined, due to the anchor effect, to the antenna circuit at the terminal joint positions.

Typically, the external terminal of an electronic component provided on the surface facing the substrate is often tapered toward the tip or rounded at the tip. In contrast, the external terminal 24A as illustrated in the figure can be formed so as to have a consistent cross-sectional shape from its root to tip. Therefore, the anchor effect can work effectively, increasing the joint strength, and the formation of the external terminals 24A can be simplified.

Figure 5:
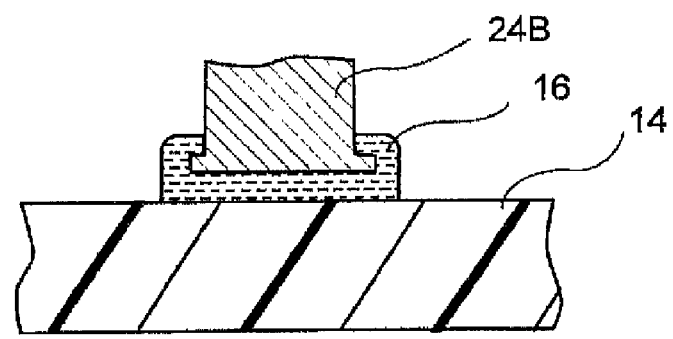
FIG. 5 A schematic cross-sectional view illustrating an external terminal with an enlarged-diameter end of an electronic component, the external terminal being landed at a terminal joint position on the substrate provided with a photocurable wiring pattern.
Figure 6:
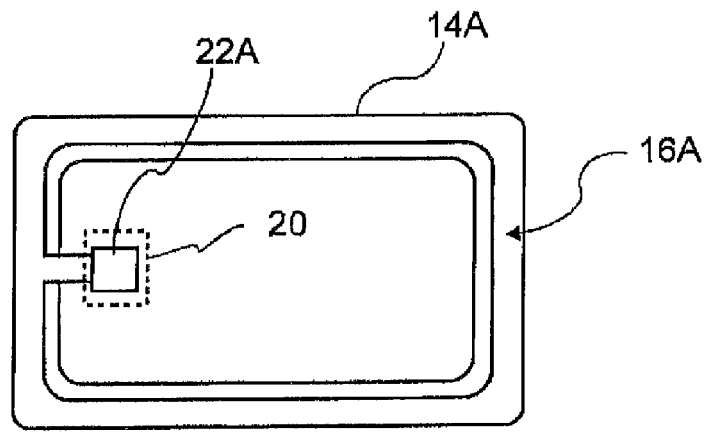
FIG. 6 A top view illustrating the bare chip component placed at the mounting position of the antenna circuit board.

As illustrated in FIG. 5, to increase the anchor effect and the joint strength, an external terminal 24B whose diameter is enlarged at only its tip end can be used as the external terminal of an electronic component. FIG. 6 is a top view illustrating an exemplary state where an electronic component is placed by a placement unit at a mounting position on the first surface of a substrate. In the figure, an IC chip 22A is placed by the placement unit 3 at the mounting position 20 on the component-mounting surface of the antenna circuit board 14A.

Figure 7:
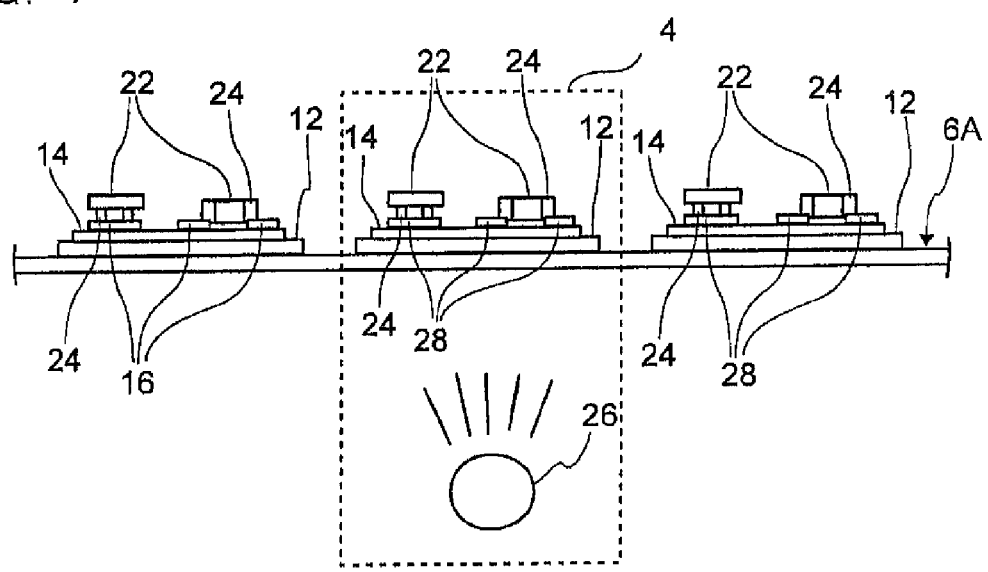
FIG. 7 A schematic view illustrating the process of curing a photocurable wiring pattern using a photoirradiation unit.

As illustrated in FIG. 7, the photoirradiation unit 4 includes a light source 26 for curing a photocurable wiring pattern 16. Examples of the light source 26 include a flash lump, a short pulse emitting unit, and a pulse laser oscillator.

Figure 8:
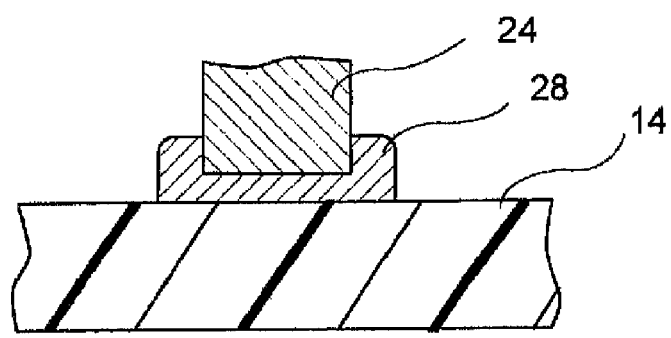
FIG. 8 A cross-sectional view detailing the junction between the conductive wiring pattern and the external terminal, formed by curing the photocurable wiring pattern.

The light source 26 can be disposed below the conveyor 6A. In other words, a light source 26A can be disposed on the second surface side of the substrate. When this is used together with the carrier board 12 and the substrate 14 both having light permeability (or light passing property), the light emitted from the light source 26 passes through the carrier board 12 and the substrate 14 from below the conveyor 6A, and reaches the topside (first surface) of the substrate 14 on which the electronic component 22 such as an IC chip or a chip component is placed. In that way, the photocurable wiring pattern 16 is irradiated with light, and cures as illustrated in FIG. 8, forming a conductive wiring pattern 28. Simultaneously therewith, the external terminals 24 of each electronic component 22 are joined to the conductive wiring pattern 28 at the terminal joint positions such that their tips are embedded in the conductive wiring pattern 28.

Next, a description is given below of a photocurable wiring-forming material. The photocurable wiring-forming material is preferably a conductive ink including metal nanoparticles, a polymer dispersant, and a solvent. The conductive ink may include, as necessary, an adhesion promoter, a surface tension modifier, a defoaming agent, a leveling additive, a rheology modifier, and an ionic strength modifier. The metal nanoparticles may be contained in the ink in an amount of about 10 to 60 mass %. The polymer dispersant may be contained in the ink in an amount of about 0.5 to 20 mass %. The ink, upon curing, preferably forms a film having a resistivity of less than about 200 μΩ·cm.

The metal nanoparticles may be copper, silver, nickel, iron, cobalt, aluminum, palladium, gold, tin, zinc, or cadmium, or any combination thereof. Particularly preferred among them is copper. The nanoparticles may be of about 0.1 μm (100 nm) or less in diameter. The dispersant may be polyamine, polyvinylpyrrolidone, polyethylene glycol, isostearyl ethyl imidazolinium ethosulfate, or oleyl ethyl imidazolinium ethosulfate, or any combination thereof. Alternatively, the dispersant may be a phosphoric acid-modified phosphate polyester copolymer, or a sulfonated styrene maleic anhydride ester, or any combination thereof. Examples of the solvent include water, and various organic solvents.

Figure 9:
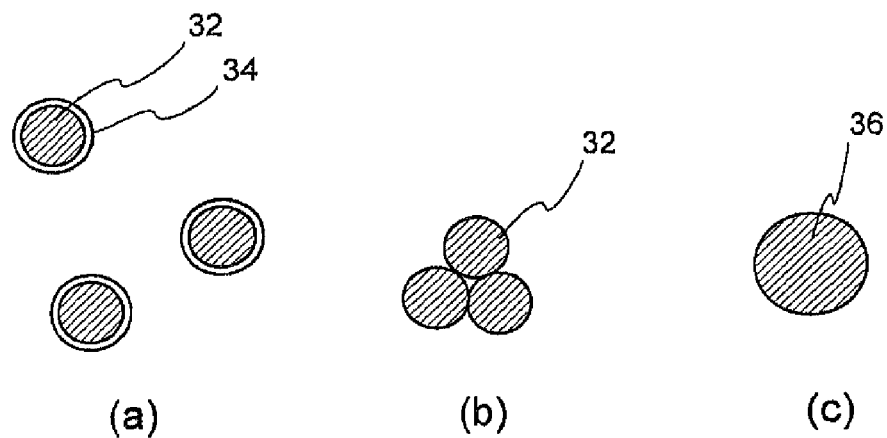
FIG. 9 A series of partial cross-sectional views schematically illustrating a curing process of a conductive ink, an example of a wiring-forming material: (a) the ink before curing, (b) the ink at the start of curing, (c) the ink upon completion of curing.

In the conductive ink, as in FIG. 9(*a*), metal nanoparticles 32 coated with a dispersant 34 are suspended in a solvent (or liquid medium). The dispersant 34 is heated to a higher temperature by irradiation with an appropriate amount of light. The dispersant 34 is thus removed from the metal nanoparticles 32 by, for example, being softened. As a result, the metal nanoparticles 32 come in direct contact with each other, and the metal nanoparticles 32 gather in this state so as to contact with each other as in FIG. 9(*b*), allowing sintering process to proceed automatically. In that way, a large number of metal nanoparticles 32 join together, into a bulk metal 36 as in FIG. 9(*c*).

When the conductive ink includes a Cu nanofiller, the external terminal 24 preferably contains Au in at least its outermost surface. This facilitates the metal-joining of the external terminal 24 to the conductive wiring pattern 28, achieving a higher joint strength.

Next, a description is given below of a case where an IC chip-mounted structure for IC cards, an example of the electronic component-mounted structure, is produced using the production system of FIG. 1.

Figure 10:
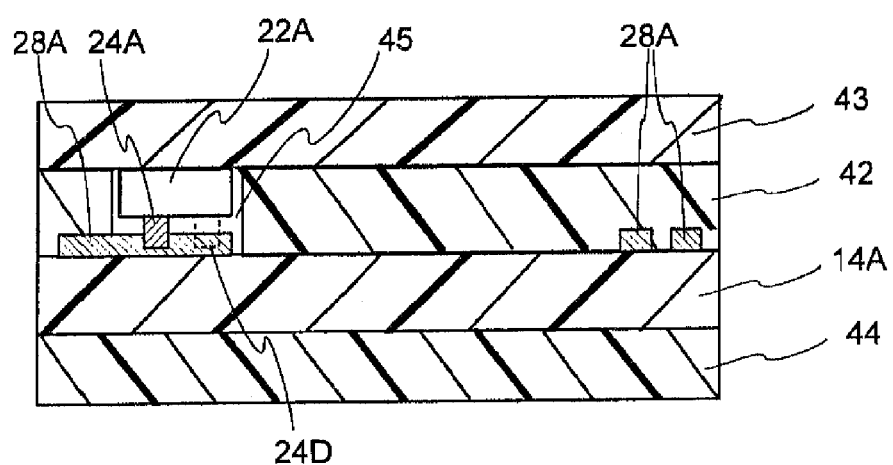
FIG. 10 A cross-sectional view of a non-contact IC card, an example of a final product including an electronic component-mounted structure.

FIG. 10 is a schematic cross-sectional view of a non-contact IC card. An IC card 40 illustrated in the figure has a layered structure. In FIG. 10, each layer of the IC card 40 is enlarged in its thickness direction for visibility. The thickness of each layer in FIG. 10 does not necessarily agree with the actual thickness ratio of the layer. In FIG. 10, the electronic component is shown as a simplified outline, rather than a cross section.

The IC card 40 in the figure includes: an antenna circuit board 14A made of resin, on which the IC chip 22A is to be mounted; a coating layer 42 made of resin, which coats the mounting surface of the antenna circuit board 14A; a first surface layer 43 made of resin, which coats the coating layer 42; and a second surface layer 44 made of resin, which coats the underside (surface opposite to the mounting surface) of the antenna circuit board 14A. A conductive wiring pattern, which is an antenna circuit 28A, is formed on the IC chip-mounting surface of the antenna circuit board 14A. A pore-like chip-housing portion 45 for housing the IC chip 22A is formed in the coating layer 42 at a portion corresponding to the position of the IC chip 22A. In the following, a description will be given of a case where the IC chip 22A is mounted onto the antenna circuit board 14A of the IC card 40.

(1) In the substrate supply unit 1, the antenna circuit board 14A without the antenna circuit 28A is loaded on the carrier board 12 set on the conveyer 6A, using a substrate loader (not shown). The antenna circuit board 14A is loaded on the carrier board 12 such that the projection shape of at least the wiring-forming region (outline of the photocurable wiring pattern 16A of FIGS. 3 and 6) of the antenna circuit board 14A does not overlap the board supports 7 of the conveyor 6A.

(2) The antenna circuit board 14A is transported by the conveyor 6A from the substrate supply unit 1 to the wiring-forming material dispensing unit 2, where the photocurable wiring pattern 16A corresponding to the antenna circuit 28A is formed on the IC chip-mounting surface of the antenna circuit board 14A. At this time, if necessary, the position and posture of the antenna circuit board 14A on the carrier board 12 can be detected from a camera image and the like.

The photocurable wiring pattern 16A can be formed using the aforementioned dispensing machine, by applying a wiring-forming material (e.g., the aforementioned conductive ink) onto the chip-mounting surface of the antenna circuit board 14A. Alternatively, the photocurable wiring pattern 16A can be formed using the aforementioned various printers, by printing with a wiring-forming material. In that way, the photocurable wiring pattern 16A as shown in FIG. 3 is formed on the chip-mounting surface of the antenna circuit board 14A. In dispensing a wiring-forming material, the needle of the dispensing machine, the mask of the screen printer, the nozzle of the ink jet printer, and other parts can be positioned with reference to the position and posture of the antenna circuit board 14A detected from a camera image and the like.

(3) The antenna circuit board 14A with the photocurable wiring pattern 16A formed thereon is transported by the conveyor 6A from the wiring-forming material dispensing unit 2 to the placement unit 3, where the IC chip 22A is placed by, for example, a chip mounter (not shown) at the mounting position 20 on the chip-mounting surface of the antenna circuit board 14A (see FIG. 6) such that the external terminals 24A land on the photocurable wiring pattern 16A at the terminal joint positions 18. As illustrated in FIG. 4, at least the tip of each external terminal 24A of the IC chip 22A is sunk in the photocurable wiring pattern 16A. At this time, if necessary, the position and posture of the antenna circuit board 14A on the carrier board 12, or the shape and posture of the photocurable wiring pattern 16A can be detected from a camera image and the like, and with reference to the detection results, the placement head of the chip mounter can be positioned.

(4) The antenna circuit board 14A with the IC chip 22A placed thereon is transported by the conveyor 6A from the placement unit 3 to the photoirradiation unit 4, where light is irradiated onto the photocurable wiring pattern 16A to cure the photocurable wiring pattern 16A. In that way, the antenna circuit 28A is formed, and simultaneously, the antenna circuit 28A is joined with the external terminals 24A. As illustrated in FIG. 7, light allowed to pass through the carrier board 12 and the antenna circuit board 14A is irradiated onto the photocurable wiring pattern 16A by the light source 26 disposed below the conveyor 6A, from the underside (second surface) of the antenna circuit board 14A.

According to the production method above, since the formation of the antenna circuit 28A and the joining of the antenna circuit 28A with the external terminals 24A can be simultaneously performed in one process (photoirradiation process), the production time of the electronic component-mounted structure (e.g., an IC chip-mounted structure for IC cards) can be shortened, leading to an improvement in its productivity.

Moreover, since the joining of the antenna circuit 28A with the external terminals 24A can be performed without heating process, it becomes unnecessary to use a highly heat-resistant material for the antenna circuit board 14A. As a result, various materials that are poor in heat resistance but excellent in properties other than that can be used as a material of the antenna circuit board 14A. For example, comparatively inexpensive materials, such as polyethylene terephthalate, polyethylene naphthalate and polycarbonate, can be used as a material of the antenna circuit board 14A for IC cards. Therefore, the production cost of IC cards can be reduced. Alternatively, materials having excellent light permeability and high dielectric breakdown voltage, such as acrylic resin and polystyrene, can be preferably used as a material of the antenna circuit board 14A for IC cards.

Furthermore, since the photocurable wiring pattern 16A is cured, with the external terminals 24A being sunk therein, the external terminals 24A can be firmly joined, due to the anchor effect, to the antenna circuit 28A at the terminal joint positions. This eliminates the necessity of a process to reinforce the junction by, for example, supplying an underfill, an anisotropic conductive paste (ACP), or an anisotropic conductive film (ACF) between the IC chip 22A and the antenna circuit board 14A. Therefore, the productivity can be further improved.

In the case where the number of external terminals 24A of the IC chip 22A is small, and a satisfactory joint strength is difficult to obtain, an appropriate number of dummy electrodes 24D may be provided on the surface of the IC chip 22A facing the substrate, as illustrated in FIG. 10, so that a desired joint strength can be obtained by curing the photocurable wiring pattern 16A, with the dummy electrodes being sunk therein. This does not increase the number of processes. Therefore, the productivity can be easily improved.

Embodiment 2

Figure 11:
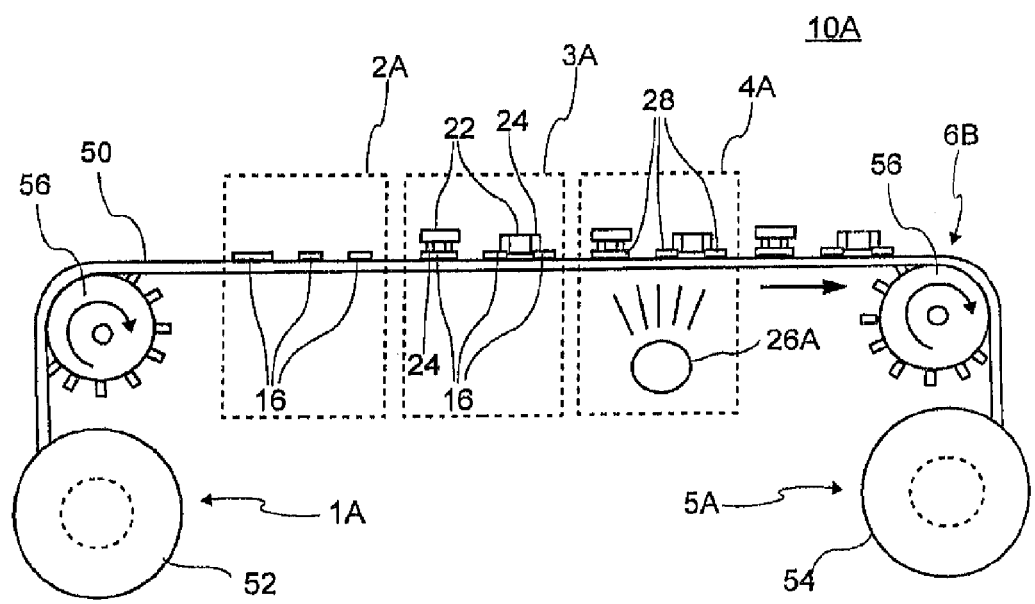
FIG. 11 An overall front view of a surface mount line which is a production system for producing an electronic component-mounted structure according to another embodiment of the present invention.

FIG. 11 is a schematic illustration of a front view of a surface mount line which is a production system for producing an electronic component-mounted structure according to one embodiment of the present invention.

A line 10A in the figure includes a substrate supply unit 1A for supplying a substrate, a wiring-forming material dispensing unit 2A, a placement unit 3A, a photoirradiation unit 4A, an electronic component-mounted structure collecting unit 5A, and a conveying machine 6B as the carrying means 6 for carrying substrates from one unit to another.

The line 10A is a surface mount line configured to mount a plurality of sets of electronic components 22, with predetermined intervals between the sets, onto a long tape-like film substrate materiel 50. The photocurable wiring pattern 16, the electronic components 22, and the external terminals 24 in FIG. 11 are the same as those in FIG. 7. In this case, the substrate supply unit 1A may include a supply roll 52 from which the film substrate material 50 is drawn, and the electronic component-mounted structure collecting unit 5A may include a take-up roll 54 on which the film substrate material 50 with electronic components mounted thereon is collected. In short, the line 10A is configured as a roll-to-roll system surface mount line.

The conveying machine 6B may include a pair of sprockets 56. In corresponding therewith, a plurality of sprocket holes may be formed at predetermined intervals on both widthwise sides of the substrate material 50. As the pair of sprockets 56 rotate with engaging with the sprocket holes in the direction indicated by the arrow in the figure, the substrate material 50 is transported from the substrate supply unit 1A, through the wiring-forming material dispensing unit 2A, the placement unit 3A, and the photoirradiation unit 4A, to the electronic component-mounted structure collecting unit 5A.

The substrate material 50 is preferably made of a light-permeable resin for the same reason as described in Embodiment 1. Examples of the light-permeable resin are the same as those listed in Embodiment 1: polyethylene, polypropylene, polybutyrene terephthalate, polyphenyl sulfide, polyether ether ketone, polyethylene terephthalate (PET), polyethylene naphthalate (PEN), polycarbonate, liquid crystal polymer, polystyrene, acrylic resin, polyacetal, polyphenyl ether, acrylonitrile-styrene copolymer, and acrylonitrile-butadiene-styrene copolymer resin. These resins may be used singly or in combination of two or more. For example, a polymer alloy of two or more resins may be used.

Figure 12A:
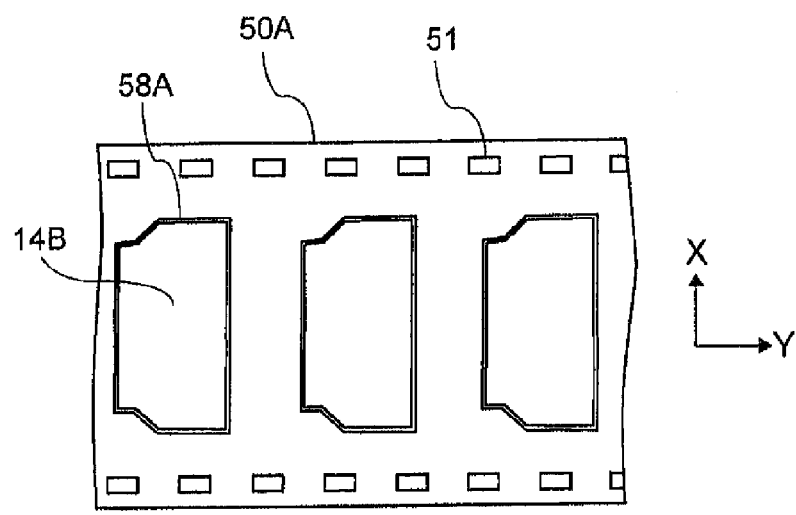
FIG. 12A A top view of an exemplary substrate material including a plurality of substrates for COF packages.

FIG. 12A is a top view of an exemplary substrate material comprising a tape-like film. A substrate material 50A illustrated in the figure is for an electronic component-mounted structure (COF package) including a liquid crystal driver and a liquid crystal panel, and has a plurality of sprocket holes 51 formed on both ends in the width direction (direction parallel to the X axis) so as to be aligned at predetermined intervals in the longitudinal direction (direction parallel to the Y axis). With the sprocket holes 51 being engaged with the pair of sprockets 56 such that the substrate material 50A is held under a certain tension, the pair of sprockets 56 is rotated. This advances the substrate material 50A in the longitudinal direction from the substrate supply unit 1A, through the wiring-forming material dispensing unit 2A, the placement unit 3A, and the photoirradiation unit 4A, to the electronic component-mounted structure collecting unit 5A.

On the substrate material 50A, substrate outlines 58A along which the substrate material 50A is to be cut are provided at predetermined intervals, so that COF packages with a liquid crystal driver mounted thereon can be cut out from the substrate material 50A. Portions encircled by the substrate outlines 58A each serve as a circuit board 14B. The substrate outlines 58A can be printed with a paint beforehand on the substrate material 50A. In dispensing (applying, printing) of a wiring-forming material in the wiring-forming material dispensing unit 2A, positioning can be performed with reference to, for example, the substrate outlines 58A recognized from a camera image and the like.

Figure 12B:
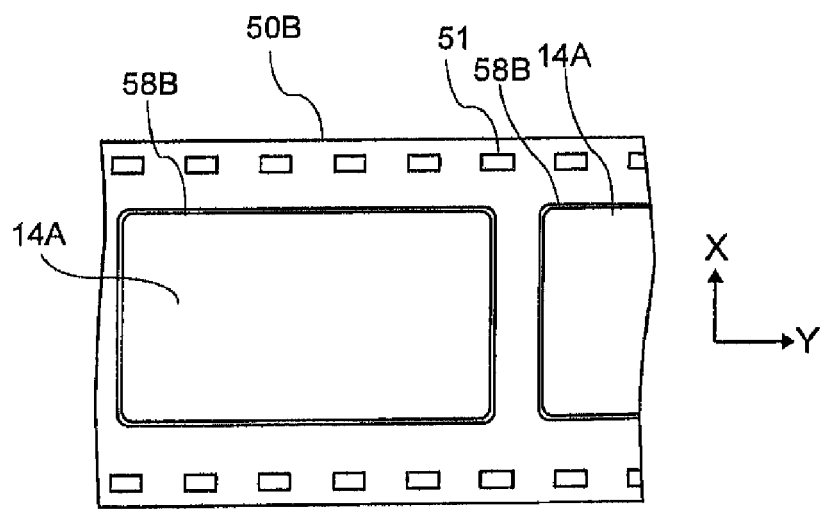
FIG. 12B A top view of another exemplary substrate material including a plurality of substrates for IC cards.

FIG. 12B is a top view of another exemplary substrate material comprising a tape-like film. A substrate material 50B illustrated in the figure is for an antenna circuit board for IC cards, and has the plurality of sprocket holes 51 formed on both ends in the width direction (direction parallel to the X axis) so as to be aligned at predetermined intervals in the longitudinal direction (direction parallel to the Y axis). With the sprocket holes 51 being engaged with the pair of sprockets 56 such that the substrate material 50B is also held under a certain tension, the pair of sprockets 56 is rotated. This advances the substrate material 50B in the longitudinal direction from the substrate supply unit 1A, through the wiring-forming material dispensing unit 2A, the placement unit 3A, and the photoirradiation unit 4A, to the electronic component-mounted structure collecting unit 5A.

On the substrate material 50B, substrate outlines 58B along which the substrate material 50B is to be cut are provided at predetermined intervals, so that antenna circuit boards with an IC chip mounted thereon are cut out from the substrate material 50B. Portions encircled by the substrate outlines 58B each serve as the antenna circuit board 14A illustrated in FIG. 3. The substrate outlines 58B can be printed with a paint beforehand on the substrate material 50B. In dispensing (applying, printing) a wiring-forming material in the wiring-forming material dispensing unit 2A, positioning can be performed with reference to, for example, the substrate outlines 58B recognized from a camera image and the like.

The wiring-forming material dispensing unit 2A may include a dispensing machine or a printing machine similar to those in Embodiment 1.

Figure 13A:
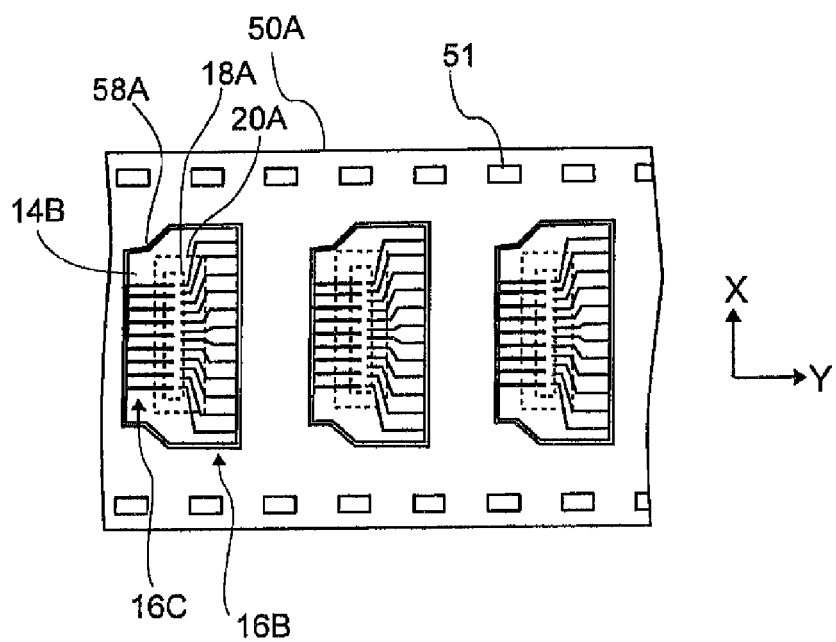
FIG. 13A A top view illustrating a photocurable wiring pattern corresponding to a connection circuit, the pattern being formed on each of the plurality of substrates for COF packages.

FIG. 13A is a top view illustrating a photocurable wiring pattern corresponding to a connection circuit for connecting one electronic component (bare chip component) with another electronic component (second electronic component), the pattern being formed every substrate by the wiring-forming material dispensing unit on an exemplary substrate material, with predetermined intervals between the patterns. A photocurable wiring pattern 16B comprises a plurality of connection lines having two end portions insulated from each other: one is near the center of the substrate 14B, and the other is near the periphery of the substrate 14B. A terminal joint position 18A of each connection line is at the end portion of the connection line near the center. The terminal joint positions 18A are included in a mounting position 20A at which an electronic component is to be placed, on the first surface of the substrate 14B (the front side of the paper).

Note that, as illustrated in FIG. 13A, in each substrate 14B of the substrate material 50A, separately from the photocurable wiring pattern 16B, a photocurable wiring pattern 16C corresponding to a connection circuit for connecting the above one electronic component with an external device may be formed by the wiring-forming material dispensing unit 2A.

Figure 13B:
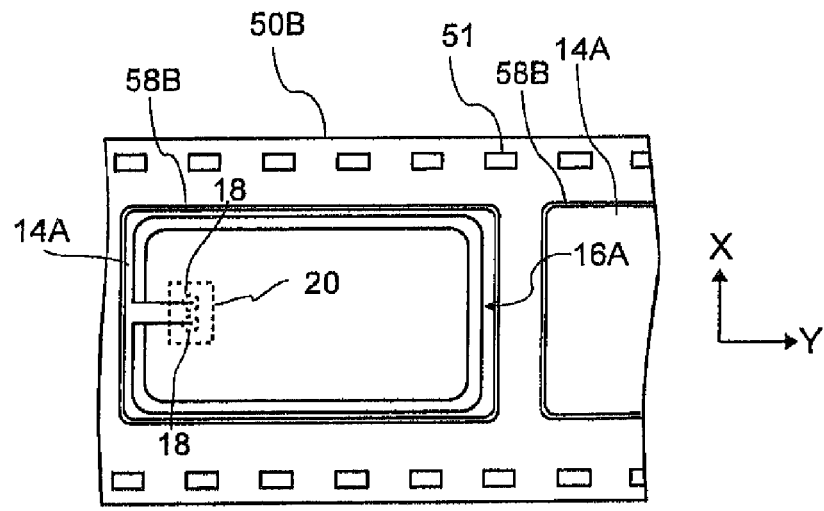
FIG. 13B A top view illustrating a photocurable wiring pattern corresponding to an antenna circuit, the pattern being formed on each of the plurality of substrates for IC cards.

FIG. 13B is a top view illustrating a photocurable wiring pattern which is formed every substrate by the wiring-forming material dispensing unit on another exemplary substrate material, with predetermined intervals between the patterns. The substrate 14A, the photocurable wiring pattern 16A, the terminal joint position 18, and the mounting position 20 in FIG. 13B are the same as those in FIG. 3, and the photocurable wiring pattern 16A is formed on the first surface of the substrate 14A (the front side of the paper).

The placement unit 3A may include an electronic component supplying machine similar to that in Embodiment 1, and a chip mounter for placing an electronic component on the substrate.

Figure 14A:
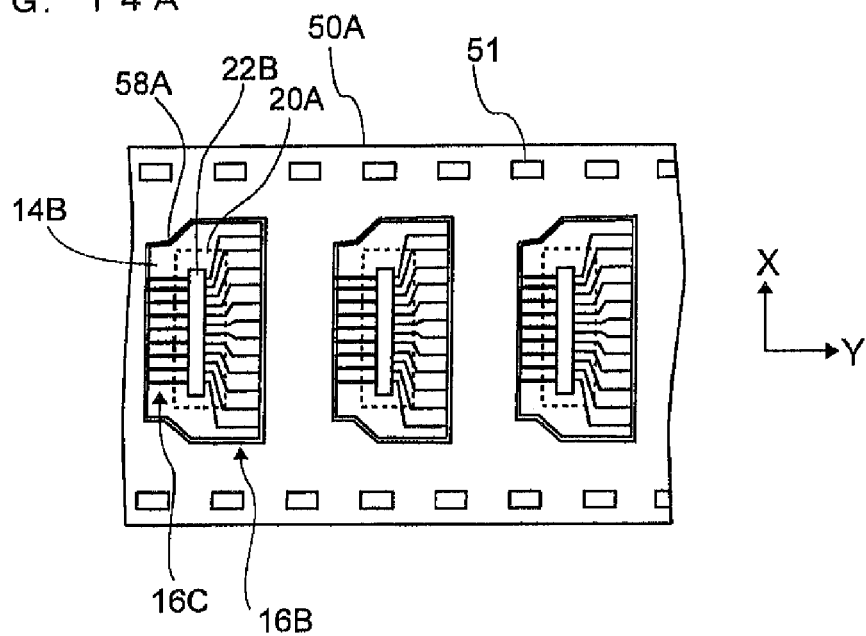
FIG. 14A A top view illustrating an electronic component, specifically, a liquid crystal driver, placed on each of the plurality of substrates for COF packages.

FIG. 14A is a top view illustrating a liquid crystal driver 22B, an example of an electronic component, placed by the placement unit 3A at each mounting position 20A on the substrate material 50A.

Figure 15:
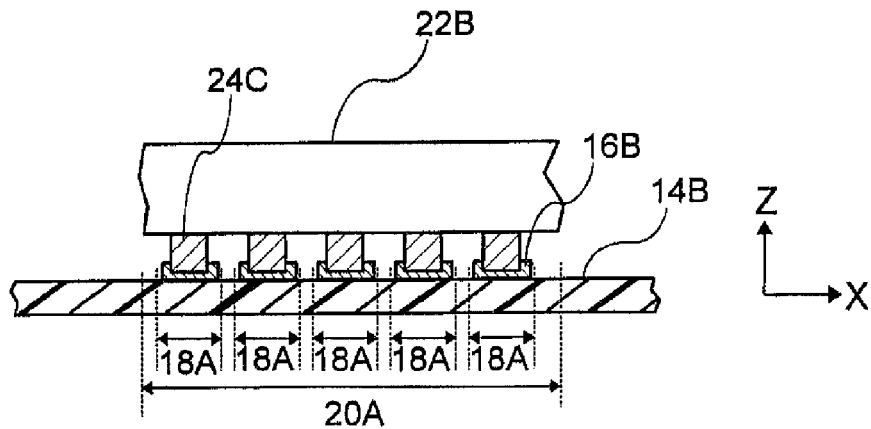
FIG. 15 A cross-sectional view illustrating the external terminal of the electronic component embedded in the photocurable wiring pattern.

As illustrated in FIG. 15, a plurality of external terminals 24C provided on the underside of the liquid crystal driver 22B are contacted with the photocurable wiring pattern 16B or the photocurable wiring pattern 16C (not shown) at each terminal joint position 18A.

In the state illustrated in the figure, since the photocurable wiring pattern 16B (and the photocurable wiring pattern 16C, the same applies hereinafter) is not yet cured, the external terminals 24C sink into the photocurable wiring pattern 16B having fluidity or deformability. Therefore, when the photocurable wiring pattern 16B is cured in the later photoirradiation process and a conductive wiring pattern (connection circuit) is formed, the external terminals 24C are firmly joined, due to the anchor effect, to the conductive wiring pattern at the terminal joint positions 18A.

As described herein before, a sufficient anchor effect can be obtained by forming the external terminal 24C so as to have a consistent cross-sectional shape from its root to tip; and an external terminal whose diameter is enlarged at its tip only can be used in order to increase the anchor effect and the joint strength.

Figure 14B:
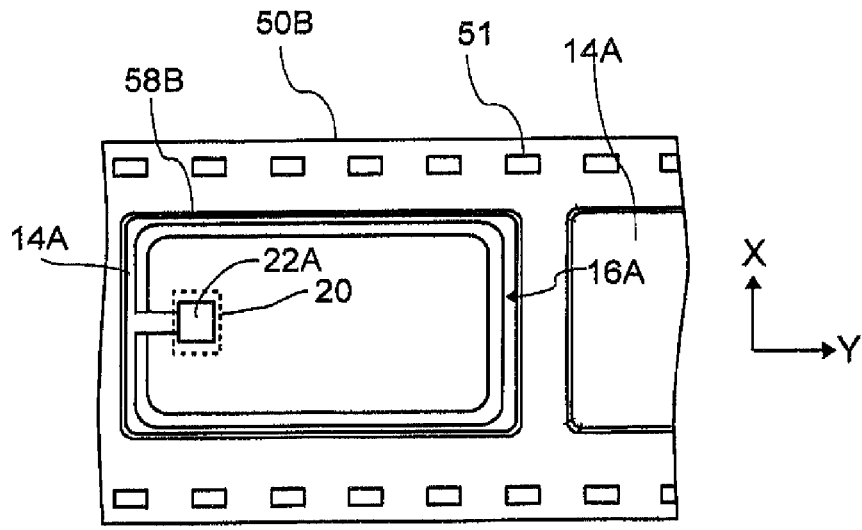
FIG. 14B A top view illustrating an electronic component, specifically, an IC chip, placed on each of the plurality of substrates for IC cards.

FIG. 14B is a top view illustrating the same IC chip 22A as illustrated in FIG. 6 placed by the placement unit 3A at each mounting position 20 on the substrate material 50B. The external terminals 24A provided on the underside of the IC chip 22A are contacted with the photocurable wiring pattern 16A at each terminal joint position 18. Since the photocurable wiring pattern 16A is not yet cured, the external terminals 24A sink into the photocurable wiring pattern 16A having fluidity or deformability.

Like in Embodiment 1, a sufficient anchor effect can be obtained by forming the external terminal 24A so as to have a consistent cross-sectional shape from its root to tip; and an external terminal whose diameter is enlarged at its tip only can be used in order to increase the anchor effect and the joint strength.

The photoirradiation unit 4A in FIG. 11 includes the light source 26A similar to that in Embodiment 1. The light source 26A can be disposed below the substrate material 50 transported by the conveying machine 6B (on the second surface side). When the substrate material 50 has light permeability, the light emitted from the light source 26A passes through the substrate material 50 and reaches the photocurable wiring pattern 16 formed on the topside of the substrate material 50. This cures the photocurable wiring pattern 16, forming a connection circuit. Simultaneously therewith, the external terminals 24 are joined to the connection circuit at the terminal joint positions. The wiring-forming material may be a conductive ink similar to that used in Embodiment 1.

Next, a description is given of an exemplary production method of producing an electronic component-mounted structure by the above production system. In the following example, a COF package (liquid crystal display module) including a liquid crystal driver and a liquid crystal panel is produced.

Figure 16A:
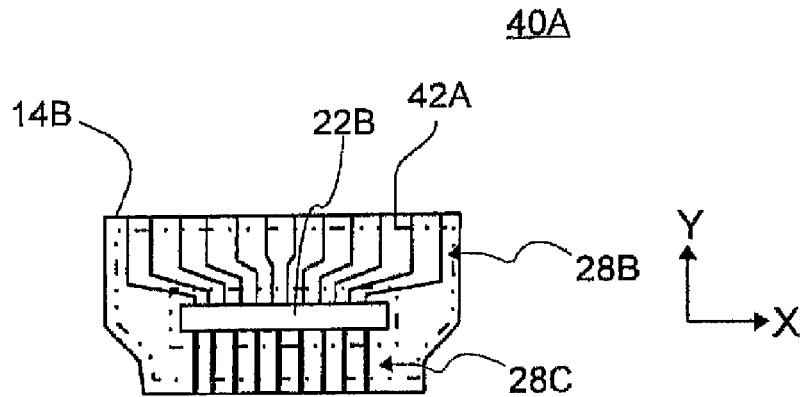
FIG. 16A A partial top view of a COF package (liquid crystal display module) including a liquid crystal driver and a liquid crystal panel, the COF package being an example of an electronic component-mounted structure produced on the surface mount line of FIG. 11.
Figure 16B:
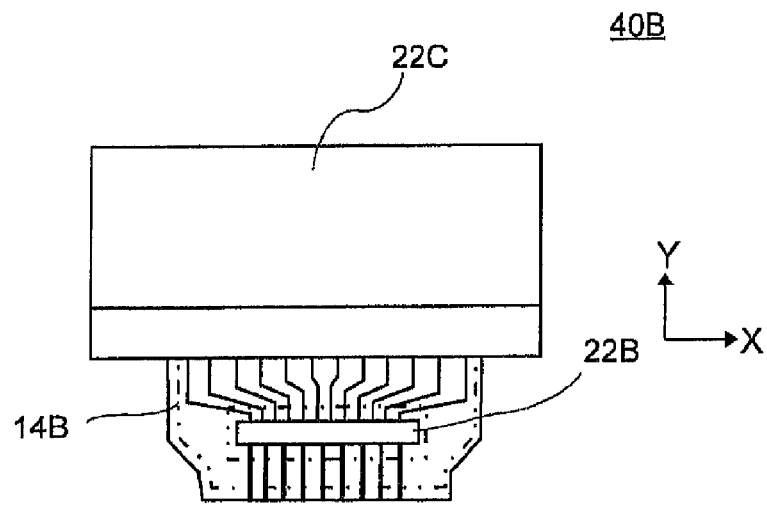
FIG. 16B A top view of the COF package including a liquid crystal driver and a liquid crystal panel.

FIG. 16A is a schematic top view partially illustrating a COF package (liquid crystal display module) including a liquid crystal driver and a liquid crystal panel (hereinafter, for descriptive purpose, the part thereof is referred to as "COF package 40A"). FIG. 16B illustrates the whole COF package (COF package 40B) including a liquid crystal driver and a liquid crystal panel. The COF package 40A illustrated in FIG. 16A includes the circuit board 14B comprising a resin film, and a resin coating layer 42A coating the mounting surface of the circuit board 14B. Note that the coating layer 42A can be omitted. A connection circuit 28B comprising a plurality of connection lines for connecting the liquid crystal driver 22B with a liquid crystal panel (not shown) is formed on a surface of the circuit board 14B for mounting the liquid crystal driver 22B thereon. In addition, a connection circuit 28C comprising a plurality of thicker connection lines for connecting the liquid crystal driver 22B with an external device is formed on the surface of the circuit board 14B for mounting the liquid crystal driver 22B thereon.

An area around the liquid crystal driver 22B is not coated with the coating layer 42A, and the mounting surface of the circuit board 14B is exposed at the area. In the following, a description will be given of a case where the COF package 40A illustrated in the figure is produced.

(1) The substrate material 50A without the connection circuits 28B and 28C, which is rolled on the supply roll 52, is set on the substrate supply unit 1A. The substrate material 50A drawn from the supply roll 52 is passed over the pair of sprockets 56, with sufficient tension applied to the substrate material, and in this state, the pair of sprockets 56 is rotated to take up a predetermined length of the substrate material 50A onto the take-up roll 54.

(2) In the wiring-forming material dispensing unit 2A, one substrate outline 58A on the substrate material 50A is recognized from a camera image and the like. When the substrate outline 58A reaches the material dispensing position in the wiring-forming material dispensing unit 2A, the transport of the substrate material 50A is stopped.

In the wiring-forming material dispensing unit 2A, the photocurable wiring patterns 16B and 16C can be formed using a dispensing machine or various printing machines as mentioned above. In that way, the photocurable wiring patterns 16B and 16C as illustrated in FIG. 13A are formed every substrate 14B within the substrate outline 58A provided on the mounting surface of the substrate material 50A. Upon formation of the photocurable wiring patterns 16B and 16C, the transport of the substrate material 50A is resumed. In dispensing a wiring-forming material, the needle of the dispensing machine, the mask of the screen printer, the nozzle of the ink jet printer, and other parts can be positioned with reference to the position and posture of the substrate outline 58A detected from a camera image and the like.

The photocurable wiring patterns 16B and 16C may be formed one set by one set, or alternatively, for example, in the case of using a screen printer, a plurality of sets of photocurable wiring patterns 16B and 16C can be formed at the same time by printing once, in correspondence with the plurality of substrates 14B. Alternatively, a predetermined number of sets of photocurable wiring patterns 16B and 16C may be formed one after another using a dispensing machine or inkjet printer, and then the transport of the substrate material 50A may be resumed.

(3) Upon completion of the formation of one or more sets of photocurable wiring patterns 16B and 16C, the pair of sprockets 56 is rotated to advance the substrate material 50A until the portion with the photocurable wiring patterns 16B and 16C formed thereon reaches the placement unit 3A. Then the liquid crystal driver 22B is placed by, for example, a chip mounter (not shown) at the mounting position 20A on the chip-mounting surface of the substrate material 50A such that the external terminals 24C land on the photocurable wiring patterns 16B and 16C at the terminal joint positions 18A (see FIGS. 14A and 15). The liquid crystal drivers 22B can be placed one after another at the mounting positions 20A of the plurality of sets of photocurable wiring patterns 16B and 16C.

At least the tip of each external terminal 24C of the liquid crystal driver 22B is sunk in the photocurable wiring patterns 16B and 16C. At this time, if necessary, the position and posture of the substrate outline 58A, or the shapes and postures of the photocurable wiring patterns 16B and 16C can be detected from a camera image and the like, and with reference to the detection results, the placement head of the chip mounter can be positioned.

(4) Upon completion of the mounting of one or a plurality of liquid crystal drivers 22B onto the substrate material 50A, the pair of sprockets 56 is rotated to advance the substrate material 50A until the portion with the photocurable wiring patterns 16B and 16C formed thereon reaches the photoirradiation unit 4A. In the photoirradiation unit 4A, light is irradiated onto one set or a plurality of sets of photocurable wiring patterns 16B and 16C to cure the photocurable wiring patterns 16B and 16C. In that way, the connection circuits 28B and 28C are formed, and simultaneously, the connection circuits 28B and 28C are joined with the external terminals 24C. As illustrated in FIG. 11, light allowed to pass through the substrate material 50A from the underside (second surface) of the substrate material 50A held in tension across the pair of sprockets 56 is irradiated onto the photocurable wiring patterns 16B and 16C.

(5) The substrate material 50A with the connection circuits 28B and 28C formed on every substrate 14B and the liquid crystal driver 22B mounted thereon is rolled onto the take-up roll 54. Upon completion of the processing to one reel of substrate material 50A, the substrate material 50A is drawn from a supply roll of a cutting machine (not shown), and cut along each substrate outline 58A into a plurality of COF packages 40A.

(6) To the connection circuit 28B of each of the COF packages 40A, the liquid crystal panel 22C is connected as shown in FIG. 16B by a mounting machine (not shown), thereby to complete a plurality of COF packages 40B.

According to the production method above, since the formation of the connection circuits 28B and 28C and the joining of the connection circuits 28B and 28C with the external terminals 24C can be simultaneously performed in one process (photoirradiation process), the production time of the COF package including a liquid crystal drive and a liquid crystal panel (or the electronic component-mounted structure) can be shortened, leading to an improvement in its productivity.

Moreover, since the joining of the connection circuits 28B and 28C with the external terminals 24C can be performed without heating process, it becomes unnecessary to use a highly heat-resistant material for the circuit board 14B. As a result, various materials that are poor in heat resistance but excellent in properties other than that can be used as a material of the circuit board 14B. For example, comparatively inexpensive materials, such as polyethylene terephthalate, polyethylene naphthalate, and polycarbonate, can be used as a material of the circuit board 14B for COF packages. Alternatively, materials having excellent light permeability and high dielectric breakdown voltage, such as acrylic resin and polystyrene, can be used as a material of the circuit board 14B for COF packages.

Furthermore, since the photocurable wiring patterns 16B and 16C are cured, with the external terminals 24C being sunk therein, the external terminals 24C can be firmly joined, due to the anchor effect, to the connection circuits 28B and 28C at the terminal joint positions. This eliminates the necessity of a process to reinforce the junction by, for example, supplying an underfill, an anisotropic conductive paste (ACP), or an anisotropic conductive film (ACF) between the liquid crystal driver 22B and the circuit board 14B. Therefore, the productivity can be further improved.

In the case where the number of external terminals 24C of the liquid crystal driver 22B is small, and a satisfactory joint strength is difficult to obtain, an appropriate number of dummy electrodes may be provided on the surface of the liquid crystal driver 22B facing the substrate, so that a desired joint strength can be obtained by curing the photocurable wiring patterns 16B and 16C, with the dummy electrodes being sunk therein. This does not increase the number of processes. Therefore, the productivity can be easily improved.

Furthermore, as compared with a carrier transport system, the production cost can be suppressed because COF packages (or electronic component-mounted structures) can be produced without using carrier boards. Moreover, the number of production processes can be reduced since the process of fixing substrates one by one on the carrier boards 12 and the process of detaching substrates one by one from the carrier boards 12 can be omitted. Thus, a shorter production time and a lower production cost can be easily achieved. Moreover, the line can be stopped immediately upon occurrence of a trouble, causing little loss in component and thus leading to a higher yield.

Next, a description will be given of a case where another electronic component-mounted structure is produced using the above production system. In the following example, an IC chip-mounted structure, specifically, an antenna circuit board with an IC chip mounted thereon is produced.

(1) The substrate material 50B without the antenna circuit 28A, which is rolled on the supply roll 52, is set on the substrate supply unit 1A. The substrate material 50B drawn from the supply roll 52 is passed over the pair of sprockets 56, with sufficient tension applied to the substrate material, and in this state, the pair of sprockets 56 is rotated to take up a predetermined length of the substrate material 50B onto the take-up roll 54.

(2) In the wiring-forming material dispensing unit 2A, one substrate outline 58B on the substrate material 50B is recognized from a camera image and the like. When the substrate outline 58B reaches the material dispensing position in the wiring-forming material dispensing unit 2A, the transport of the substrate material 50B is stopped.

In the wiring-forming material dispensing unit 2A, the photocurable wiring pattern 16A can be formed using a dispensing machine or various printing machines as mentioned above. In that way, the photocurable wiring pattern 16A as illustrated in FIG. 13B is formed every substrate 14A within the substrate outline 58B provided on the mounting surface of the substrate material 50B. Upon formation of the photocurable wiring pattern 16A, the transport of the substrate material 50B is resumed. In dispensing a wiring-forming material, the needle of the dispensing machine, the mask of the screen printer, the nozzle of the ink jet printer, and other parts can be positioned with reference to the position and posture of the substrate outline 58B detected from a camera image and the like.

The photocurable wiring pattern 16A may be formed one set by one set, or alternatively, for example, in the case of using a screen printer, a plurality of sets of photocurable wiring patterns 16A can be formed at the same time by printing once, in correspondence with the plurality of substrates 14A. Alternatively, a predetermined number of sets of photocurable wiring pattern 16A may be formed one after another using a dispensing machine or inkjet printer, and then the transport of the substrate material 50B may be resumed.

(3) Upon completion of the formation of one set or a plurality of sets of photocurable wiring patterns 16A, the pair of sprockets 56 is rotated to advance the substrate material 50B until the portion with the photocurable wiring patterns 16A formed thereon reaches the placement unit 3A. Then the IC chip 22A is placed by, for example, a chip mounter (not shown) at the mounting position 20 on the chip-mounting surface of the substrate material 50B such that the external terminals 24A land on the photocurable wiring pattern 16A at the terminal joint positions 18. The IC chip 22A can be placed one after another at the mounting positions 20 of the plurality of sets of photocurable wiring patterns 16A.

At least the tip of each external terminal 24A of the IC chip 22A is sunk in the photocurable wiring pattern 16A. At this time, if necessary, the position and posture of the substrate outline 58B, or the shape and posture of the photocurable wiring pattern 16A can be detected from a camera image and the like, and with reference to the detection results, the placement head of the chip mounter can be positioned.

(4) Upon completion of the mounting of one or more IC chips 22A onto the substrate material 50B, the pair of sprockets 56 is rotated to advance the substrate material 50B until the portion with the photocurable wiring patterns 16A formed thereon reaches the photoirradiation unit 4A. In the photoirradiation unit 4A, light is irradiated onto one set or a plurality of sets of photocurable wiring patterns 16A to cure the photocurable wiring patterns 16A. In that way, the antenna circuits 28A are formed, and simultaneously, the antenna circuits 28A are joined with the external terminals 24A. As illustrated in FIG. 11, light allowed to pass through the substrate material 50B from the underside (second surface) of the substrate material 50B held in tension across the pair of sprockets 56 is irradiated onto the photocurable wiring patterns 16A.

(5) The substrate material 50B with the antenna circuit 28A formed on every substrate 14A and the IC chip 22A mounted thereon is collected by the take-up roll 54. Upon completion of the processing to one reel of substrate material 50B, the substrate material 50B is drawn from a supply roll of a cutting machine (not shown), and cut along each substrate outline 58B into a plurality of IC chip-mounted structures.

According to the production method above, since the formation of the antenna circuit 28A and the joining of the antenna circuit 28A with the external terminals 24A can be simultaneously performed in one process (photoirradiation process), the production time of the IC chip-mounted structures for IC cards can be shortened, leading to an improvement in its productivity.

Moreover, since the joining of the antenna circuit 28A with the external terminals 24A can be performed without heating process, it becomes unnecessary to use a highly heat-resistant material for the antenna circuit board 14A. As a result, various materials that are poor in heat resistance but excellent in properties other than that can be used as a raw material of the antenna circuit board 14A. For example, comparatively inexpensive materials, such as polyethylene terephthalate, polyethylene naphthalate, and polycarbonate, can be used as a material of the antenna circuit board 14A for IC cards. Alternatively, materials having excellent light permeability and high dielectric breakdown voltage, such as acrylic resin and polystyrene, can be preferably used as a material of the antenna circuit board 14A for IC cards.

Furthermore, since the photocurable wiring pattern 16A is cured, with the external terminals 24A being sunk therein, the external terminals 24A can be firmly joined, due to the anchor effect, to the antenna circuit 28A at the terminal joint positions. This eliminates the necessity of a process to reinforce the junction by, for example, supplying an underfill, an anisotropic conductive paste (ACP), or an anisotropic conductive film (ACF) between the IC chip 22A and the antenna circuit board 14A. Therefore, the productivity can be further improved.

In the case where the number of external terminals 24A of the IC chip 22A is small, and a satisfactory joint strength is difficult to obtain, an appropriate number of dummy electrodes may be provided on the surface of the IC chip 22A facing the substrate, so that a desired joint strength can be obtained by curing the photocurable wiring pattern 16A, with the dummy electrodes being sunk therein. This does not increase the number of processes. Therefore, the productivity can be easily improved.

Furthermore, as compared with a carrier transport system, the production cost can be suppressed because electronic component-mounted structures can be produced without using carrier boards. Moreover, the number of production processes can be reduced since the process of fixing substrates one by one on the carrier boards 12 and the process of detaching substrates one by one from the carrier boards 12 can be omitted. Thus, a shorter production time and a lower production cost can be easily achieved. Moreover, the line can be stopped immediately upon occurrence of a trouble, causing little loss in component and thus leading to a higher yield.

Embodiment 3

Figure 17:
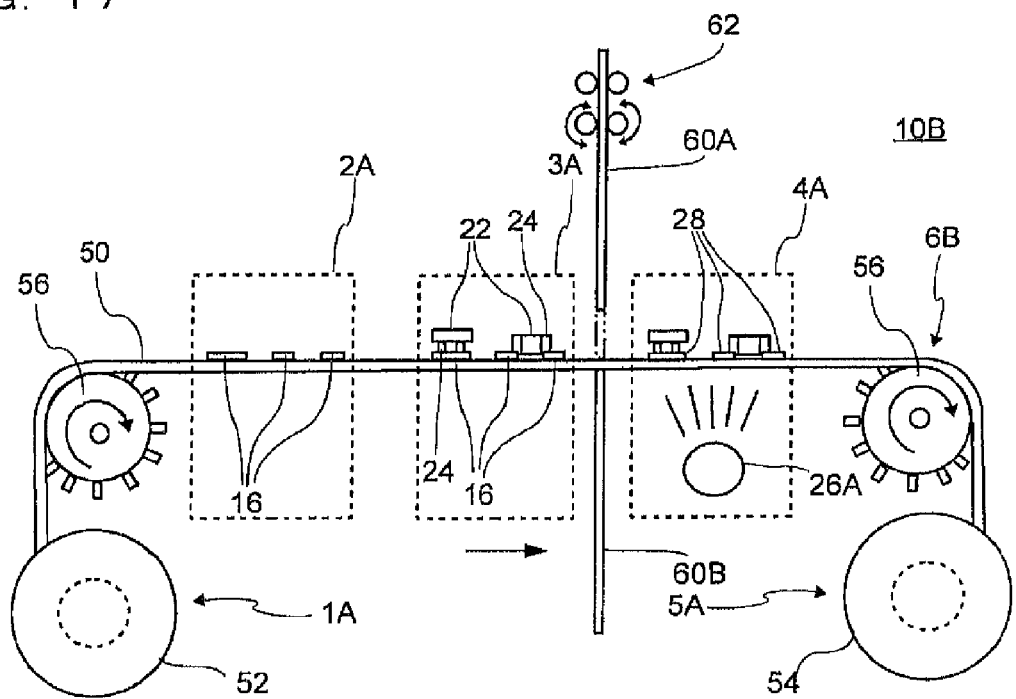
FIG. 17 An overall front view of a surface mount line which is a production system for producing an electronic component-mounted structure according to yet another embodiment of the present invention.

FIG. 17 is a front view schematically illustrating a surface mount line which is a production system for producing an electronic component-mounted structure according to one embodiment of the present invention.

A line 10B illustrated in the figure differs from the line 10A of FIG. 11 in that a pair of light-shielding plates 60A and 60B are disposed between the placement unit 3A and the photoirradiation unit 4A. In the following, the difference is mainly described using the same drawings and reference numerals as used in Embodiments 1 and 2.

The line 10B is a roll-to-roll system surface mount line configured to mount a plurality of sets of electronic components, with predetermined intervals between the sets, onto a long tape-like film substrate materiel. For the same reason as described in Embodiment 1, the substrate material is preferably formed of a light-permeable resin similar to those mentioned in Embodiment 1. The wiring-forming material may be a conductive ink similar to those mentioned above. The substrate material, photocurable wiring pattern and electronic component shown in FIG. 17 are the same as the substrate material 50, photocurable wiring pattern 16, and electronic component 22 shown in FIG. 11 etc.

If the wiring-forming material dispensing unit 2A, the placement unit 3A and the photoirradiation unit 4A are each equipped with, for example, a housing that optically separates the interior from the exterior completely, it would be possible to transport the substrate to the photoirradiation unit 4A, without irradiating light onto the photocurable wiring pattern of the substrate on which no electronic component is mounted yet. However, providing each unit with such a housing can increase the cost. Therefore, rather than by providing a housing on each unit, by providing a light-shielding means between, for example, the placement unit 3A and the photoirradiation unit 4A, light irradiation onto the photocurable wiring pattern of the substrate on which no electronic component is mounted yet is prevented. It thus becomes possible, while suppressing an increase in cost, to form a conductive wiring pattern and, simultaneously, to join the conductive wiring pattern with the external terminals of an electronic component.

More specifically, the line 10B includes: the pair of light-shielding plates 60A and 60B disposed perpendicular to the transport direction of the substrate material 50 so as to sandwich the substrate material 50 transported by the conveying machine 6B; and a light-shielding plate mover 62 for moving one of the light-shielding plates 60A in the direction perpendicular to the transport direction of the substrate material 50. The pair of light-shielding plates 60A and 60B is disposed between the placement unit 3A and the photoirradiation unit 4A.

The light-shielding plate 60A is arranged on the electronic component-mounting surface side of the substrate material 50, and the light-shielding plate 60B is arranged on the side opposite thereto. The light-shielding plate mover 62 can be composed of, for example, one or more pairs of rollers that rotate while sandwiching the light-shielding plate 60A therebetween. The light-shielding plate 60A is movable by the light-shielding plate mover 62, between the light-shielding position indicated by the two-dot chain line in the figure and the open position indicated by the solid line in the figure. On the other hand, the light-shielding plate 60B can be fixed at the position where the upper end thereof contacts the underside of the substrate material 50.

A description will be given below of a case where the COF package 40A illustrated in FIG. 16A is produced on the line 10B.

(1) The substrate material 50A without the connection circuits 28B and 28C, which is rolled on the supply roll 52, is set on the substrate supply unit 1A. The substrate material 50A drawn from the supply roll 52 is passed over the pair of sprockets 56, with sufficient tension applied to the substrate material, and in this state, the pair of sprockets 56 is rotated to take up a predetermined length of the substrate material 50A onto the take-up roll 54.

(2) In the wiring-forming material dispensing unit 2A, one substrate outline 58A on the substrate material 50A is recognized from a camera image and the like. When the substrate outline 58A reaches the material dispensing position in the wiring-forming material dispensing unit 2A, the transport of the substrate material 50A is stopped.

In the wiring-forming material dispensing unit 2A, the photocurable wiring patterns 16B and 16C can be formed using a dispensing machine or various printing machines as mentioned above. In that way, the photocurable wiring patterns 16B and 16C as illustrated in FIG. 13A are formed every substrate 14B within the substrate outline 58A provided on the mounting surface of the substrate material 50A. Upon formation of the photocurable wiring patterns 16B and 16C, the transport of the substrate material 50A is resumed. In dispensing a wiring-forming material, the needle of the dispensing machine, the mask of the screen printer, the nozzle of the ink jet printer, and other parts can be positioned with reference to the position and posture of the substrate outline 58A detected from a camera image and the like.

The photocurable wiring patterns 16B and 16C may be formed one set by one set, or alternatively, for example, in the case of using a screen printer, a plurality of sets of photocurable wiring patterns 16B and 16C can be formed at the same time by printing once, in correspondence with the plurality of substrates 14B. Alternatively, a predetermined number of sets of photocurable wiring patterns 16B and 16C may be formed one after another using a dispensing machine or inkjet printer, and then the transport of the substrate material 50A may be resumed.

(3) Upon completion of the formation of one set or a plurality of sets of photocurable wiring patterns 16B and 16C, the pair of sprockets 56 is rotated to advance the substrate material 50A until the portion with the photocurable wiring patterns 16B and 16C formed thereon reaches the placement unit 3A. Then the liquid crystal driver 22B is placed by, for example, a chip mounter (not shown) at the mounting position 20A on the chip-mounting surface of the substrate material 50A such that the external terminals 24C land on the photocurable wiring patterns 16B and 16C at the terminal joint positions 18A (see FIGS. 14A and 15). The liquid crystal driver 22B can be placed one after another at the mounting positions 20A of the plurality of sets of photocurable wiring patterns 16B and 16C.

At least the tip of each external terminal 24C of the liquid crystal driver 22B is sink in the photocurable wiring patterns 16B and 16C. At this time, if necessary, the position and posture of the substrate outline 58A, or the shapes and postures of the photocurable wiring patterns 16B and 16C can be detected from a camera image and the like, and with reference to the detection results, the placement head of the chip mounter can be positioned. While placing the liquid crystal driver 22B in the placement unit 3A, the aforementioned formation of the photocurable wiring patterns is performed in the wiring-forming material dispensing unit 2A.

(4) Upon completion of the mounting of one or more liquid crystal drivers 22B onto the substrate material 50A, the light-shielding plate 60A, if at the light-shielding position, is moved by the light-shielding plate mover 62 from the light-shielding position to the open position. Thereafter, the pair of sprockets 56 is rotated to advance the substrate material 50A until the portion with the photocurable wiring patterns 16B and 16C formed thereon reaches the photoirradiation unit 4A. Here, if the light-shielding plate 60A is at the open position, the substrate material 50A is advanced, without moving the plate.

Subsequently, the light-shielding plate 60A is moved from the open position to the light-shielding position by the light-shielding plate mover 62. Thereafter, in the photoirradiation unit 4A, light is irradiated onto one or more sets of photocurable wiring patterns 16B and 16C to cure the photocurable wiring patterns 16B and 16C. In that way, the connection circuits 28B and 28C are formed, and simultaneously, the connection circuits 28B and 28C are joined with the external terminals 24C.

As illustrated in FIG. 17, light is allowed to pass through the substrate material 50A from the underside (second surface) of the substrate material 50A held in tension across the pair of sprockets 56, and is irradiated onto the photocurable wiring patterns 16B and 16C. Concurrently with forming the connection circuits 28B and 28C in the photoirradiation unit 4A, the aforementioned placement of the liquid crystal driver 22B is performed in the placement unit 3A.

(5) Upon completion of the formation of one or more sets of connection circuits 28B and 28C, and the joining of the external terminals 24C, the emission of light from the light source 26A is stopped. Thereafter, the light-shielding plate 60A is moved from the light-shielding position to the open position by the light-shielding plate mover 62. In this state, the pair of sprockets 56 is rotated to advance one or more substrates 14A with the connection circuits 28B and 28C formed thereon toward the electronic component-mounted structure collecting unit 5A. The subsequent processes are similar to those described in Embodiment 2.

As described above, with the line 10B, in which a light-shielding means is disposed between the placement unit 3A and the photoirradiation unit 4A so that light will not be irradiated onto the photocurable wiring pattern of the substrate on which no electronic component is mounted yet, it becomes possible to form a conductive wiring pattern and, simultaneously, to join the conductive wiring pattern with the external terminals of the electronic component, while suppressing an increase in cost.

A description will be given below of a case where an IC chip-mounted structure for IC cards as illustrated in FIG. 10 is produced.

(1) The substrate material 50B without the antenna circuit 28A, which is rolled on the supply roll 52, is set on the substrate supply unit 1A. The substrate material 50B drawn from the supply roll 52 is passed over the pair of sprockets 56, with sufficient tension applied to the substrate material, and in this state, the pair of sprockets 56 is rotated to take up a predetermined length of the substrate material 50B onto the take-up roll 54.

(2) In the wiring-forming material dispensing unit 2A, one substrate outline 58B on the substrate material 50B is recognized from a camera image and the like. When the substrate outline 58B reaches the material dispensing position in the wiring-forming material dispensing unit 2A, the transport of the substrate material 50B is stopped.

In the wiring-forming material dispensing unit 2A, the photocurable wiring pattern 16A can be formed using a dispensing machine or various printing machines as mentioned above. In that way, the photocurable wiring pattern 16A as illustrated in FIG. 13B are formed every substrate 14A within the substrate outline 58B provided on the mounting surface of the substrate material 50B. Upon formation of the photocurable wiring pattern 16A, the transport of the substrate material 50B is resumed. In dispensing a wiring-forming material, the needle of the dispensing machine, the mask of the screen printer, the nozzle of the ink jet printer, and other parts can be positioned with reference to the position and posture of the substrate outline 58B detected from a camera image and the like.

The photocurable wiring pattern 16A may be formed one set by one set, or alternatively, for example, in the case of using a screen printer, a plurality of sets of photocurable wiring patterns 16A can be formed at the same time by printing once, in correspondence with the plurality of substrates 14A. Alternatively, a predetermined number of sets of photocurable wiring patterns 16A may be formed one after another using a dispensing machine or inkjet printer, and then the transport of the substrate material 50B may be resumed.

(3) Upon completion of the formation of one or more sets of photocurable wiring patterns 16A, the pair of sprockets 56 is rotated to advance the substrate material 50B until the portion with the photocurable wiring patterns 16A formed thereon reaches the placement unit 3A. Then the IC chip 22A is placed by, for example, a chip mounter (not shown) at the mounting position 20 on the chip-mounting surface of the substrate material 50B such that the external terminals 24A land on the photocurable wiring pattern 16A at the terminal joint positions 18 (see FIG. 14B). The IC chip 22A can be placed one after another at the mounting positions 20 of the plurality of sets of photocurable wiring patterns 16A.

At least the tip of each external terminal 24A of the IC chip 22A is sunk in the photocurable wiring pattern 16A. At this time, if necessary, the position and posture of the substrate outline 58B, or the shape and posture of the photocurable wiring pattern 16A can be detected from a camera image and the like, and with reference to the detection results, the placement head of the chip mounter can be positioned. Concurrently with placing the IC chip 22A in the placement unit 3A, the aforementioned formation of the photocurable wiring patterns is performed in the wiring-forming material dispensing unit 2A.

(4) Upon completion of the mounting of one or more IC chips 22A onto the substrate material 50B, the light-shielding plate 60A, if at the light-shielding position, is moved by the light-shielding plate mover 62 from the light-shielding position to the open position. Thereafter, the pair of sprockets 56 is rotated to advance the substrate material 50B until the portion with the photocurable wiring patterns 16A formed thereon reaches the photoirradiation unit 4. Here, if the light-shielding plate 60A is at the open position, the substrate material 50B is advanced, without moving the plate.

Subsequently, the light-shielding plate 60A is moved from the open position to the light-shielding position by the light-shielding plate mover 62. Thereafter, in the photoirradiation unit 4A, light is irradiated onto the one or more sets of photocurable wiring patterns 16A to cure the photocurable wiring patterns 16A. In that way, the antenna circuits 28A are formed, and simultaneously, the antenna circuits 28A are joined with the external terminals 24A.

As illustrated in FIG. 17, light is allowed to pass through the substrate material 50B from the underside (second surface) of the substrate material 50B held in tension across the pair of sprockets 56, and is irradiated onto the photocurable wiring patterns 16A. Concurrently with forming the antenna circuits 28A in the photoirradiation unit 4, the aforementioned placement of the IC chip 22A is performed in the placement unit 3A.

(5) Upon completion of the formation of one or more sets of antenna circuits 28A, and the joining of the external terminals 24A, the emission of light from the light source 26A is stopped. Thereafter, the light-shielding plate 60A is moved from the light-shielding position to the open position by the light-shielding plate mover 62. In this state, the pair of sprockets 56 is rotated to advance one or more substrates 14A with the antenna circuit 28A formed thereon toward the electronic component-mounted structure collecting unit 5A. The subsequent processes are similar to those as described in Embodiment 2.

As described above, according to the line 10B, since a light-shielding means is disposed between the placement unit 3A and the photoirradiation unit 4A so that light will not be irradiated onto the photocurable wiring pattern of the substrate on which no electronic component is mounted yet, it is possible to form an antenna circuit and, simultaneously, to join the antenna circuit with the external terminals of the bare chip component, while suppressing an increase in cost.

Figure 18:
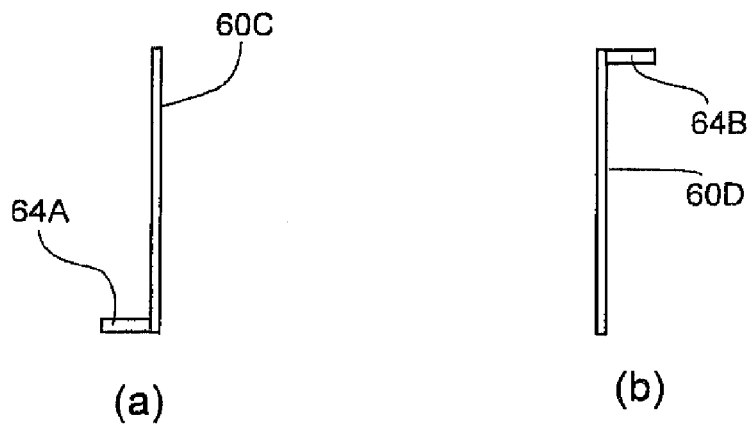
FIG. 18 A front view of a variant of a pair of light-shielding plates used in the surface mount line of FIG. 17.

Variants of the light-shielding means of Embodiment 3 are illustrated in FIG. 18. FIG. 18(a) illustrates a variant of one of the light-shielding plates 60A arranged on the mounting surface side. A light-shielding plate 60C illustrated in the figure has a protrusion 64A disposed at the lower end (the substrate material-side end) so as to extend in parallel with the transport direction of the substrate material 50. FIG. 18(b) illustrates a variant of the other one of the light-shielding plates 60B. A light-shielding plate 60D illustrated in the figure has a protrusion 64B disposed at the upper end (the substrate material-side end) so as to extend in parallel with the transport direction of the substrate material 50.

Figure 19:
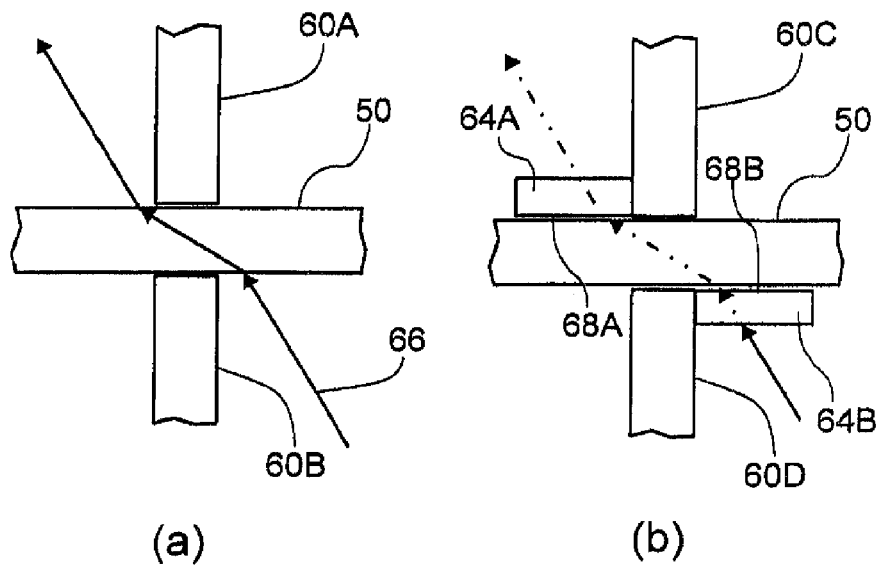
FIG. 19 Front views of the light-shielding plates and the substrate material, for explaining the operating principle of the light-shielding plates of FIG. 18.

As illustrated in FIG. 19(a), with the light-shielding plates 60A and 60B, light obliquely incident on the principle surface of the substrate material 50 may enter into the placement unit 3A (the left-handed side in the figure) due to refraction. However, by providing the light-shielding plates 60A and 60B with at least one of the protrusions 64A and 64B, light obliquely incident on the principle surface of the substrate material 50 can be effectively blocked as can be done with the light-shielding plates 60C and 60D illustrated in FIG. 19(b). To prevent the reflection of light, the color of surfaces 68A and 68B facing the substrate material 50 of the protrusions 64A and 64B is preferably matte black.

Embodiment 4

In the following, a yet another embodiment of the present invention will be described with reference to FIGS. 20 and 21.

Figure 20:
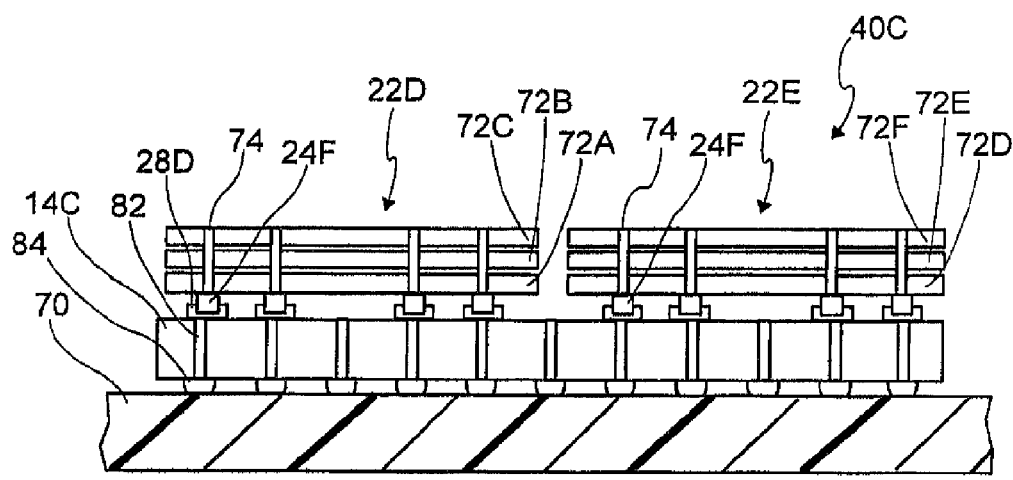
FIG. 20 A front view illustrating an electronic component-mounted structure including a multilayer substrate and a glass interposer, the structure being placed on another substrate.

FIG. 20 is a front view illustrating a state where an electronic component-mounted structure according to the present embodiment is mounted on another substrate such as a motherboard.

In an example of FIG. 20, an electronic component package 40C, an example of the electronic component-mounted structure, is mounted on a motherboard 70, an example of the another substrate. The electronic component package 40C includes two semiconductor stacks 22D and 22E as electronic components, and a glass interposer 14C.

The semiconductor stack 22D includes a CPU (central processing unit) 72A and two memories 72B and 72C, each being a bare chip component, which are connected to each other with a plurality of through electrodes 74. Likewise, the semiconductor stack 22E includes a GPU (graphics processing unit) 72D and two memories 72E and 72F, each being a bare chip component, which are connected to each other with a plurality of through electrodes 74.

One end (lower end in the figure) of each of the through electrodes 74 of the semiconductor stacks 22D and 22E is connected to an external terminal 24F provided in a protruding manner on the undersurface (or the surface facing the glass interposer 14C) of each of the semiconductor stacks 22D and 22E.

The glass interposer 14C has a plurality of thicknesswise extending through-holes which are arranged, for example, in a matrix. A relay electrode 82 is inserted in each through hole. One end (lower end in the figure) of each relay electrode 82 is connected to a solder bump 84 provided in a protruding manner on the underside (or the surface facing the motherboard 70) of the glass interposer 14C. The other ends (upper end in the figure) of at least some of the relay electrodes 82 are respectively connected to a plurality of land electrodes 28D formed on the topside of the glass interposer 14C (or the mounting surface of the electronic component package 40C) so as to correspond to the external terminals 24F. The external terminals 24F are respectively jointed to the land electrodes 28D such that at least part of each of the external terminals 24F is embedded in the land electrode 28D.

Figure 21:
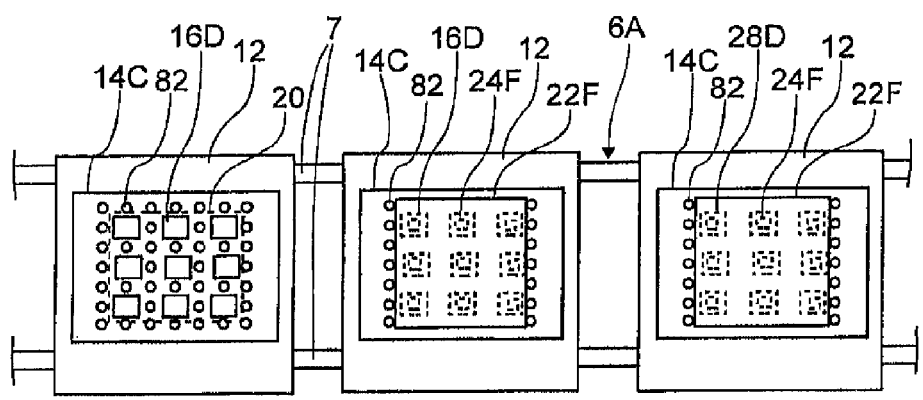
FIG. 21 A schematic top view of the conveyor for explaining a production process of producing the electronic component-mounted structure of FIG. 20 on the surface mount line employing a carrier transport system.

FIG. 21 is a top view of the conveyor, illustrating the carrier boards 12 similar to those of Embodiment 1 placed with certain intervals therebetween on the conveyor 6A similar to that as illustrated in FIGS. 2A and 2B, and a glass interposer placed on each carrier board. The carrier board 12 illustrated in the figure, like in Embodiment 1, has light permeability. In the state (a) on the left-handed end in FIG. 21, electrode precursors 16D are formed on the topside of the glass interposer 14C at positions where the plurality of land electrodes 28D are to be formed. Here, the electrode precursors 16D can be formed from the aforementioned wiring-forming material (e.g., conductive ink). The formation of the electrode precursors 16D can be performed using the wiring-forming material dispensing unit 2 of FIG. 1. The wiring-forming material dispensing unit 2 may include the aforementioned dispensing machine or printing machine.

In the state (b) in the middle of FIG. 21, a semiconductor stack 22F having the external terminals 24F is placed as an electronic component by the placement unit 3 similar to that in Embodiment 1, at the mounting position 20 on the topside of the glass interposer 14C such that the external terminals 24F land on the electrode precursors 16D. Likewise in FIG. 4, part of each external terminal 24F is sunk in the electrode precursors 16D.

In the state (c) on the right-handed end in FIG. 21, light is irradiated onto the electrode precursors 16D by the photoirradiation unit 4 similar to that in Embodiment 1, and the electrode precursors 16D are cured into the land electrodes 28D. Simultaneously therewith, the external terminals 24F are joined to the land electrodes 28D such that they are embedded in the land electrodes 28D. This can improve the productivity of component-mounting substrates, and ensure a high connection reliability. As a result, the use of an underfill and other reinforcement materials can be omitted. Furthermore, since the electronic components and glass interposers are not subjected to heat or high pressure when joining the external terminals with the substrate electrodes, for example, a thin plate glass of about 0.1 mm thick can be used for the glass interposer. Therefore, miniaturization and reduction in thickness of component-mounting substrates can be easily achieved.

Here, the antenna circuit 14A as illustrated in FIGS. 3 and 6 may be a glass interposer similar to the glass interposer 14C. In this case, the photocurable wiring pattern 16A for an antenna circuit is formed on one principal surface of the glass interposer, and the external terminals 24A are joined to the antenna circuit 28A at the terminal joint positions, in the same manner as in Embodiment 1, whereby the productivity and the connection reliability can be improved as can be done in Embodiment 1. Furthermore, in place of a semiconductor stack, a single layer IC chip can be mounted on the glass interposer.

INDUSTRIAL APPLICABILITY

According to the present invention, the external terminals of the electronic component are joined to the conductive wiring pattern of the substrate surface such that the external terminals are embedded in the conductive wiring pattern. This ensures a high connection reliability between the electronic component and the conductive wiring pattern. Therefore, the present invention can be suitably applied to a liquid crystal display module, an IC card, and the like.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

REFERENCE SIGNS LIST

1: Substrate supply unit, 2: Wiring-forming material dispensing unit, 3: Placement unit, 4: Photoirradiation unit, 5: Electronic component-mounted structure collecting unit, 6: Carrying means, 6A: Conveyer, 6B: Conveying machine, 7: Board support, 10, 10A: Line, 12: Carrier board, 14: Substrate, 14A: Antenna circuit board, 14B: Circuit board, 14C: Glass interposer, 16, 16A to 16C: Photocurable wiring pattern, 18, 18A: Terminal joint position, 20, 20A: Mounting position, 22A: IC chip, 22B: Liquid crystal driver, 22D, 22E: Semiconductor stack, 24, 24A to 24C: External terminal, 24D: Dummy electrode, 26, 26A: Light source, 28: Conductive wiring pattern, 28A: Antenna circuit, 28B: Connection circuit, 28D: Land electrode, 32: Metal nanoparticles, 34: Dispersant, 40: IC card, 40A: COF package

The invention claimed is:

1. An electronic component-mounted structure comprising:
 a substrate,
 a conductive wiring pattern formed on a surface of the substrate, and
 an electronic component having an external terminal and being placed on the surface of the substrate at a mounting position including a terminal joint position of the conductive wiring pattern,
 the external terminal being joined to the conductive wiring pattern at the terminal joint position, the external terminal being embedded in the conductive wiring pattern,
 the conductive wiring pattern being formed by curing a photocurable wiring-forming material that has fluidity or deformability and includes a solvent, a dispersant, and metal nanoparticles coated with the dispersant in the solvent,
 the substrate having light permeability, and
 the metal nanoparticles being in direct contact and join with each other.

2. The electronic component-mounted structure according to claim 1, wherein the wiring-forming material contains Cu particles having an average particle diameter of 1 to 10 nm.

3. The electronic component-mounted structure according to claim 1, wherein the external terminal of the electronic component contains Cu in at least an outermost surface of the external terminal.

4. The electronic component-mounted structure according to claim 1, wherein the substrate is a film substrate.

5. An IC card comprising:
 a substrate,
 an antenna circuit formed on a surface of the substrate, and
 a bare chip component having an external terminal and being placed on the surface of the substrate at a mounting position including a terminal joint position of the antenna circuit,
 the external terminal being joined to the antenna circuit at the terminal joint position, and the external terminal being embedded in the antenna circuit,
 the antenna circuit being formed by curing a photocurable wiring-forming material that has fluidity or deformability and includes a solvent, a dispersant, and metal nanoparticles coated with the dispersant in the solvent,
 the substrate having light permeability, and
 the metal nanoparticles being in direct contact and join with each other.

6. The IC card according to claim 5, wherein the wiring-forming material includes Cu particles having an average particle diameter of 1 to 10 nm.

7. The IC card according to claim 5, wherein the substrate includes at least one selected from polyethylene terephthalate, polyethylene naphthalate, polyethylene, polypropylene, polybutylene terephthalate, polyphenyl sulfide, polyether ether ketone, polycarbonate, liquid crystal polymer, polystyrene, acrylic resin, polyacetal, polyphenyl ether, acrylonitrile-styrene copolymer, and acrylonitrile-butadiene-styrene copolymer resin.

8. The IC card according to claim 5, wherein the substrate is a film substrate.

9. A COF package comprising:
 a film substrate,
 a conductive wiring pattern formed on a surface of the substrate,
 a first electronic component having an external terminal and being placed on the surface of the substrate at a mounting position including a terminal joint position of the conductive wiring pattern, and
 a second electronic component connected to the first electronic component via the conductive wiring pattern,
 the external terminal of the first electronic component being joined to the conductive wiring pattern at the terminal joint position, the external terminal being embedded in the conductive wiring pattern,
 the conductive wiring pattern being formed by curing a photocurable wiring-forming material that has fluidity or deformability and includes a solvent, a dispersant, and metal nanoparticles coated with the dispersant in the solvent,
 the substrate having light permeability, and
 the metal nanoparticles being in direct contact and join with each other.

10. The COF package according to claim 9, wherein the wiring-forming material includes Cu particles having an average particle diameter of 1 to 10 nm.

11. The COF package according to claim 9, wherein the substrate includes at least one selected from polyethylene terephthalate, polyethylene naphthalate, polyethylene, polypropylene, polybutylene terephthalate, polyphenyl sulfide, polyether ether ketone, polycarbonate, liquid crystal polymer, polystyrene, acrylic resin, polyacetal, polyphenyl ether, acrylonitrile-styrene copolymer, and acrylonitrile-butadiene-styrene copolymer resin.

12. The electronic component-mounted structure according to claim 1, wherein the wiring-forming material is cured by irradiating light through the substrate onto the wiring-forming material, with the external terminal being sunk in the wiring-forming material at the terminal joint position, thereby to remove the dispersant from the metal nanoparticles, so that the metal nanoparticles come into direct contact and join with each other.

13. The IC card according to claim 5, wherein the wiring-forming material is cured by irradiating light through the substrate onto the wiring-forming material, with the external terminal being sunk in the wiring-forming material at the terminal joint position, thereby to remove the dispersant from the metal nanoparticles, so that the metal nanoparticles come into direct contact and join with each other.

14. The COF package according to claim 9, wherein the wiring-forming material is cured by irradiating light through the substrate onto the wiring-forming material, with the external terminal being sunk in the wiring-forming material at the terminal joint position, thereby to remove the dispersant from the metal nanoparticles, so that the metal nanoparticles come into direct contact and join with each other.

\* \* \* \* \*